United States Patent
Lee et al.

(10) Patent No.: US 12,002,912 B2
(45) Date of Patent: Jun. 4, 2024

(54) LIGHT EMITTING DEVICE AND DISPLAY APPARATUS HAVING THE SAME

(71) Applicant: SEOUL VIOSYS CO., LTD., Gyeonggi-do (KR)

(72) Inventors: Seom Geun Lee, Gyeonggi-do (KR); Seong Kyu Jang, Gyeonggi-do (KR); Yong Woo Ryu, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 380 days.

(21) Appl. No.: 17/381,744

(22) Filed: Jul. 21, 2021

(65) Prior Publication Data

US 2022/0037570 A1 Feb. 3, 2022

Related U.S. Application Data

(60) Provisional application No. 63/059,340, filed on Jul. 31, 2020.

(51) Int. Cl.
*H01L 33/62* (2010.01)
*H01L 25/075* (2006.01)
*H01L 27/15* (2006.01)

(52) U.S. Cl.
CPC .......... *H01L 33/62* (2013.01); *H01L 25/0756* (2013.01); *H01L 27/156* (2013.01)

(58) Field of Classification Search
None
See application file for complete search history.

(56) References Cited

U.S. PATENT DOCUMENTS

2018/0233536 A1   8/2018  Chang
2020/0152692 A1*  5/2020  Liao .................. H01L 27/156

FOREIGN PATENT DOCUMENTS

| KR | 1020170005642 A | 1/2017 |
| KR | 1020200085771 A | 7/2020 |
| WO | 2019079253 A1 | 4/2019 |
| WO | 2019125051 A1 | 6/2019 |

OTHER PUBLICATIONS

International Search Report for International Application No. PCT/KR2021/009851, mailed Nov. 19, 2021, 3 pages.

* cited by examiner

*Primary Examiner* — Robert K Carpenter
(74) *Attorney, Agent, or Firm* — Perkins Coie LLP

(57) ABSTRACT

A stacked light emitting device includes a first LED stack, a second LED stack disposed under the first LED stack, a third LED stack disposed under the second LED stack, a third-1 connector and a third-2 connector disposed between the second LED stack and the third LED stack, and a plurality of pads disposed over the first LED stack, and electrically connected to the first, second, and third LED stacks. Each of the first, second, and third LED stacks has a light generation region and a peripheral region disposed around the light generation region.

20 Claims, 26 Drawing Sheets

LIGHT EMITTING DEVICE AND DISPLAY APPARATUS HAVING THE SAME

CROSS-REFERENCE TO RELATED APPLICATION

This application claims priority from and the benefit of U.S. Provisional Patent Application No. 63/059,340, filed on Jul. 31, 2020, which is hereby incorporated by reference for all purposes as if fully set forth herein.

TECHNICAL FIELD

Exemplary embodiments relate to an LED display apparatus implementing an image using a light emitting diode.

BACKGROUND

Recently, an LED display apparatus that directly implements an image using a light emitting diode has been developed. The LED display apparatus implements an image using LEDs of a small size, such as micro-scale inorganic semiconductor LEDs, and is expected to replace a conventional LCD display or OLED display.

In general, the LED display apparatus displays various colors through mixture of blue, green, and red light. In order to realize various images, the LED display apparatus includes a plurality of pixels, each including blue, green, and red sub-pixels. As such, a color of a certain pixel is typically determined based on colors of the sub-pixels, and images can be realized through a combination of such pixels.

Since LEDs can emit various colors depending upon materials thereof, it is possible to provide a display apparatus by arranging individual LED chips emitting blue, green and red light on a two-dimensional plane. However, when one LED chip is arranged in each sub-pixel, the number of LED chips may be increased, which may require excessive time for a mounting process during manufacture. Moreover, since the sub-pixels are arranged on the two-dimensional plane in the display apparatus, a relatively large area is occupied by one pixel that includes the sub-pixels for blue, green, and red light.

In order to solve these drawbacks, a light emitting device having a stacked structure in which a blue LED, a green LED, and a red LED are stacked in a vertical direction has been developed. The stacked light emitting device can implement blue light, green light, and red light with a single chip, so that the number of light emitting devices required for a display apparatus can be reduced to ⅓ compared to a conventional one. Accordingly, it is possible to drastically reduce a mounting process time of the light emitting devices, and also, it is possible to reduce an occurrence of defective devices after mounting.

Light emitting devices are mounted in a group on a panel substrate or the like using a surface mounting technique or the like, and pads need to be formed on the light emitting devices for this purpose. However, in the stacked light emitting device, it is difficult to form the pads having a stable structure due to the vertically stacked structure. Moreover, a current density input to the LEDs needs to be increased to drive the LEDs under high external quantum efficiency. The current density can be increased by reducing an area of the light emitting device under a predetermined current, and the reduction of an area of the light emitting device makes it more difficult to form the pads.

Furthermore, a difference in viewing angles of blue light, green light, and red light emitted from the stacked light emitting device may occur. The difference in the viewing angles of blue light, green light, and red light makes it difficult to implement a display image. In particular, light emitted from an LED close to a light exiting surface, for example, the green LED, may be emitted in a lateral direction to widen the viewing angle, and light interference may occur between adjacent pixels by such light.

SUMMARY

Exemplary embodiments provide a light emitting device having a stable structure suitable for surface mounting, and a display apparatus having the same.

Exemplary embodiments provide a light emitting device suitable for stably forming pads and a display apparatus having the same.

Exemplary embodiments provide a display apparatus capable of preventing light interference between pixels.

Exemplary embodiments provide a display apparatus capable of narrowing a viewing angle of light emitted from each LED of a stacked light emitting device.

An exemplary embodiment provides a stacked light emitting device. The light emitting device includes a first LED stack, a second LED stack disposed under the first LED stack, a third LED stack disposed under the second LED stack, a third-1 connector and a third-2 connector disposed between the second LED stack and the third LED stack, and a plurality of pads disposed over the first LED stack, and electrically connected to the first, second, and third LED stacks. Each of the first, second, and third LED stacks has a light generation region and a peripheral region disposed around the light generation region. The third-1 connector and the third-2 connector are electrically connected to a first conductivity type semiconductor layer and a second conductivity type semiconductor layer of the light generation region of the third LED stack, respectively, and at least one of the third-1 connector and the third-2 connector covers a side surface of the peripheral region of the third LED stack.

An exemplary embodiment provides a display apparatus. The display apparatus includes a circuit board and a plurality of light emitting devices mounted on the circuit board. The plurality of light emitting devices includes a first LED stack, a second LED stack disposed under the first LED stack, a third LED stack disposed under the second LED stack, a third-1 connector and a third-2 connector disposed between the second LED stack and the third LED stack, and a plurality of pads disposed over the first LED stack, and electrically connected to the first, second, and third LED stacks. Each of the first, second, and third LED stacks has a light generation region and a peripheral region disposed around the light generation region. The third-1 connector and the third-2 connector are electrically connected to a first conductivity type semiconductor layer and a second conductivity type semiconductor layer of the light generation region of the third LED stack, respectively. St least one of the third-1 connector and the third-2 connector covers a side surface of the peripheral region of the third LED stack. The plurality of pads is bonded toward the circuit board.

DESCRIPTION OF DRAWINGS

FIG. 5A is a plan view illustrating a third LED stack grown on a substrate;

FIG. 5B is a cross-sectional view taken along line A-A' of FIG. 5A;

FIG. 6A is a plan view illustrating forming a first insulation layer and a third transparent electrode;

FIG. 6B is a cross-sectional view taken along line A-A' of FIG. 6A;

FIG. 7A is a plan view illustrating forming a third-1 connector and a third-2 connector;

FIG. 7B is a cross-sectional view taken along line A-A' of FIG. 7A;

FIG. 8A is a plan view illustrating attaching a second LED stack on the third LED stack;

FIG. 8B is a cross-sectional view taken along line A-A' of FIG. 8A;

FIG. 9A is a plan view illustrating forming through holes in a peripheral region of the second LED stack;

FIG. 9B is a cross-sectional view taken along line A-A' of FIG. 9A;

FIG. 10A is a plan view illustrating forming a second insulation layer and a second transparent electrode;

FIG. 10B is a cross-sectional view taken along line A-A' of FIG. 10A;

FIG. 11A is a plan view illustrating forming a second-1 connector, a second intermediary connector, and a second-2 connector;

FIG. 11B is a cross-sectional view taken along line A-A' of FIG. 11A;

FIG. 12A is a plan view illustrating a first LED stack attached to the second LED stack;

FIG. 12B is a cross-sectional view taken along line A-A' of FIG. 12A;

FIG. 13A is a plan view illustrating forming through holes passing through the first LED stack;

FIG. 13B is a cross-sectional view taken along line A-A' of FIG. 13A;

FIG. 14A is a plan view illustrating forming a third insulation layer and a first ohmic electrode;

FIG. 14B is a cross-sectional view taken along line A-A' of FIG. 14A;

FIG. 15A is a plan view illustrating forming a first-1 connector, a first-1 intermediary connector, a first-2 intermediary connector, and a first-2 connector;

FIG. 15B is a cross-sectional view taken along line A-A' of FIG. 15A;

FIG. 16A is a plan view illustrating a separation process for separating LEDs on a substrate from adjacent LEDs;

FIG. 16B is a cross-sectional view taken along line A-A' of FIG. 16A;

FIG. 17A is a plan view illustrating forming a protection insulation layer; and

FIG. 17B is a cross-sectional view taken along line A-A' of FIG. 17A.

DETAILED DESCRIPTION OF THE ILLUSTRATED EXEMPLARY EMBODIMENTS

Figure 1:
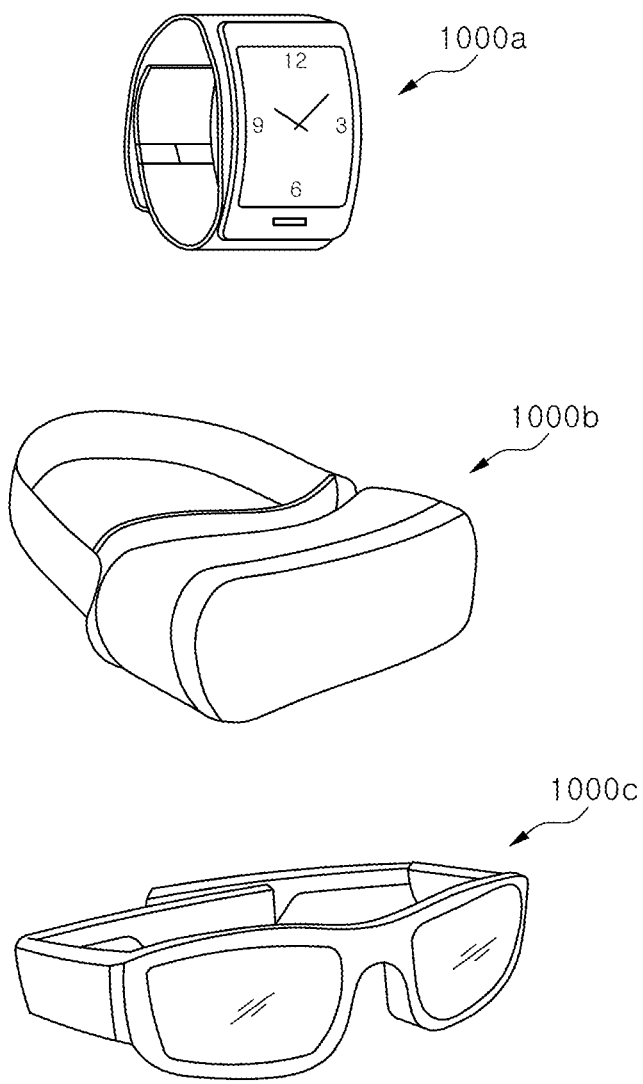
FIG. 1 shows schematic perspective views illustrating display apparatuses according to exemplary embodiments.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

An exemplary embodiment provides a stacked light emitting device. The light emitting device includes a first LED stack, a second LED stack disposed under the first LED stack, a third LED stack disposed under the second LED stack, a third-1 connector and a third-2 connector disposed between the second LED stack and the third LED stack, and a plurality of pads disposed over the first LED stack, and electrically connected to the first, second, and third LED stacks. Each of the first, second, and third LED stacks has a light generation region and a peripheral region disposed around the light generation region, the third-1 connector and the third-2 connector are electrically connected to a first conductivity type semiconductor layer and a second conductivity type semiconductor layer of the light generation region of the third LED stack, respectively. At least one of the third-1 connector and the third-2 connector covers a side surface of the peripheral region of the third LED stack.

As the third-1 connector or the third-2 connector covers the side surface of the peripheral region of the third LED stack, light toward the outside through the side of the third LED stack may be blocked. As such, light interference between the light emitting devices may be reduced, and a difference in viewing angles between the first, second, and third LED stacks may be reduced.

The third-1 connector and the third-2 connector may cover 80% or more, further, 90% or more, furthermore, 95% or more of the side surface of the peripheral region of the third LED stack.

Moreover, the third-1 connector and the third-2 connector may cover 80% or more, further, 90% or more, furthermore, 95% or more of a side surface of the light generation region of the third LED stack.

The third-1 connector and the third-2 connector may cover most of the light generation region to block light from being emitted to the side surface of the light generation region.

In an exemplary embodiment, the third-1 connector and the third-2 connector may cover the side surface of the light generation region of the third LED stack, respectively. In another exemplary embodiment, one of the third-1 connector and the third-2 connector may cover the side surface of the light generation region, and the other one may be spaced apart from the light generation region in a lateral direction.

The light emitting device may further include a second-1 connector, a second intermediary connector, and a second-2 connector disposed between the first LED stack and the second LED stack. The second-1 connector and the second-2 connector may be electrically connected to a first conductivity type semiconductor layer and a second conductivity type semiconductor layer of the second LED stack, respectively. The second intermediary connector may be electrically connected to the third-2 connector through the peripheral region of the second LED stack.

At least one of the second-1 connector, the second intermediary connector, and the second-2 connector may cover a side surface of the peripheral region of the second LED stack.

The second-1 connector, the second intermediary connector, and the second-2 connector may cover 80% or more, further, 90% or more, furthermore, 95% or more of the side surface of the peripheral region of the second LED stack.

The second-1 connector, the second intermediary connector, and the second-2 connector may cover 80% or more, further, 90% or more, furthermore, 95% or more of a side surface of the light generation region of the second LED stack.

In an exemplary embodiment, the second-1 connector, the second intermediary connector, and the second-2 connector may cover the side surface of the light generation region of the second LED stack, respectively. In another exemplary embodiment, any one or two of the second-1 connector, the second intermediary connector, and the second-2 connector may be spaced apart from the light generation region in a lateral direction.

The light emitting device may further include a first-1 connector, a first-2 connector, a first-1 intermediary connector, and a first-2 intermediary connector disposed between the first LED stack and the plurality of pads. The first-1 connector and the first-2 connector may be electrically connected to a first conductivity type semiconductor layer and a second conductivity type semiconductor layer of the first LED stack. The first-1 intermediary connector and the first-2 intermediary connector may be electrically connected to the second intermediary connector and the second-2 connector through the peripheral region of the first LED stack, respectively.

Further, the first-1 connector, the second-1 connector, and the third-1 connector may be electrically connected to one another, the first-2 connector, the second-2 connector, and the third-2 connector may be electrically spaced apart from one another. The pads may include a first pad electrically connected to the first-1 connector, the second-1 connector and second to fourth pads electrically connected to the third-2 connector, second-2 connector, and first-2 connector, respectively.

In addition, the first, second, third, and fourth pads may be disposed on the peripheral region of the first LED stack, respectively.

The first-1 connector, the first-2 connector, the first-1 intermediary connector, and the first-2 intermediary connector may cover 80% or more, further 90% or more, furthermore 95% or more of a side surface of the light generation region of the first LED stack.

In an exemplary embodiment, the first-1 connector, the first-2 connector, the first-1 intermediary connector, and the first-2 intermediary connector may cover the side surface of the light generation region of the first LED stack, respectively. In another exemplary embodiment, any one of two, or three of the first-1 connector, the first-2 connector, the first-1 intermediary connector, and the first-2 intermediary connector may be spaced apart from the light generation region in a lateral direction.

The peripheral regions of the first, second, and third LED stacks may surround the light generation regions of the first, second, and third LED stacks, respectively, and the light generation regions of the first, second, and third LED stacks may be at least partially overlapped with one another.

In an exemplary embodiment, the light generation regions of the first, second, and third LED stacks may be overlapped with one another by 90% or more.

In an exemplary embodiment, the light generation regions of the first, second, and third LED stacks may have a same shape, and may be arranged in a same arrangement direction. In another exemplary embodiment, at least one of the light generation regions of the first, second, and third LED stacks may have a shape different from those of the remaining ones, and even when they have the same shape, they may be arranged in a different arrangement direction. For example, the light generation region of the first LED stack may have a different shape or be arranged in a different arrangement direction from those of the light generation regions of the second and third LED stacks.

The light emitting device may further include a light-transmitting substrate disposed under the third LED stack, and the substrate may have a concave-convex pattern on a surface facing the third LED stack.

The light emitting device may further include a bonding layer disposed between the substrate and the third LED stack, and the third LED stack may have a concave-convex pattern on a surface facing the substrate.

The concave-convex pattern of the third LED stack may be denser than the concave-convex pattern of the substrate.

An exemplary embodiment provides a display apparatus. The display apparatus includes a circuit board and a plurality of light emitting devices mounted on the circuit board. The plurality of light emitting devices include a first LED stack, a second LED stack disposed under the first LED stack, a third LED stack disposed under the second LED stack, a third-1 connector and a third-2 connector disposed between the second LED stack and the third LED stack, and a plurality of pads disposed over the first LED stack, and electrically connected to the first, second, and third LED stacks. Each of the first, second, and third LED stacks has a light generation region and a peripheral region disposed around the light generation region, the third-1 connector and the third-2 connector are electrically connected to a first conductivity type semiconductor layer and a second conductivity type semiconductor layer of the light generation region of the third LED stack, respectively. At least one of the third-1 connector and the third-2 connector covers a side surface of the peripheral region of the third LED stack, and the plurality of pads is bonded toward the circuit board.

Hereinafter, exemplary embodiments of the inventive concepts will be described in detail with reference to the accompanying drawings. FIG. 1 shows schematic perspective views illustrating display apparatuses according to exemplary embodiments.

A light emitting device according to the exemplary embodiment is not particularly limited, and as one example, it may be used in a VR display apparatus such as a smart watch 1000a or a VR headset 1000b, or an AR display apparatus such as augmented reality glasses 1000c. In addition, the light emitting device of the present disclosure may be used in various sizes of TVs and head-up display apparatuses of automobiles.

Figure 2:
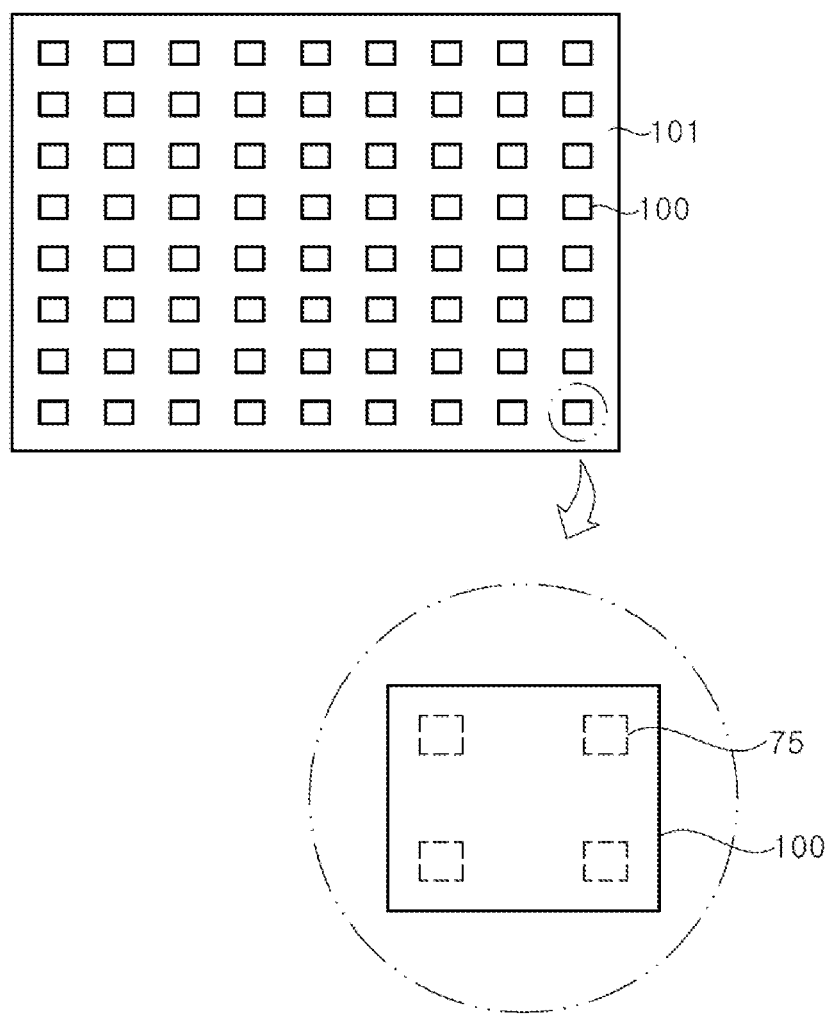
FIG. 2 is a schematic plan view illustrating a display panel according to an exemplary embodiment.

A display panel for implementing an image is mounted in the display apparatus. FIG. 2 is a schematic plan view illustrating the display panel according to an exemplary embodiment.

Referring to FIG. 2, the display panel includes a circuit board 101 and light emitting devices 100. The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

The plurality of light emitting devices 100 is arranged on the circuit board 101. Each of the light emitting devices 100 constitutes one pixel. The light emitting device 100 has bump pads 75, and the bump pads 75 are electrically connected to the circuit board 101. For example, the bump pads 75 may be bonded to pads exposed on the circuit board 101.

The light emitting devices 100 may be arranged on one circuit board 101 to constitute the display panel, but the inventive concepts are not limited thereto. For example, each of the light emitting devices 100 may be mounted on a plurality of mounting substrates, and the mounting substrates on which the light emitting devices 100 are arranged may be mounted on the circuit board 101 using, for example, a tiling technique.

Figure 3A:
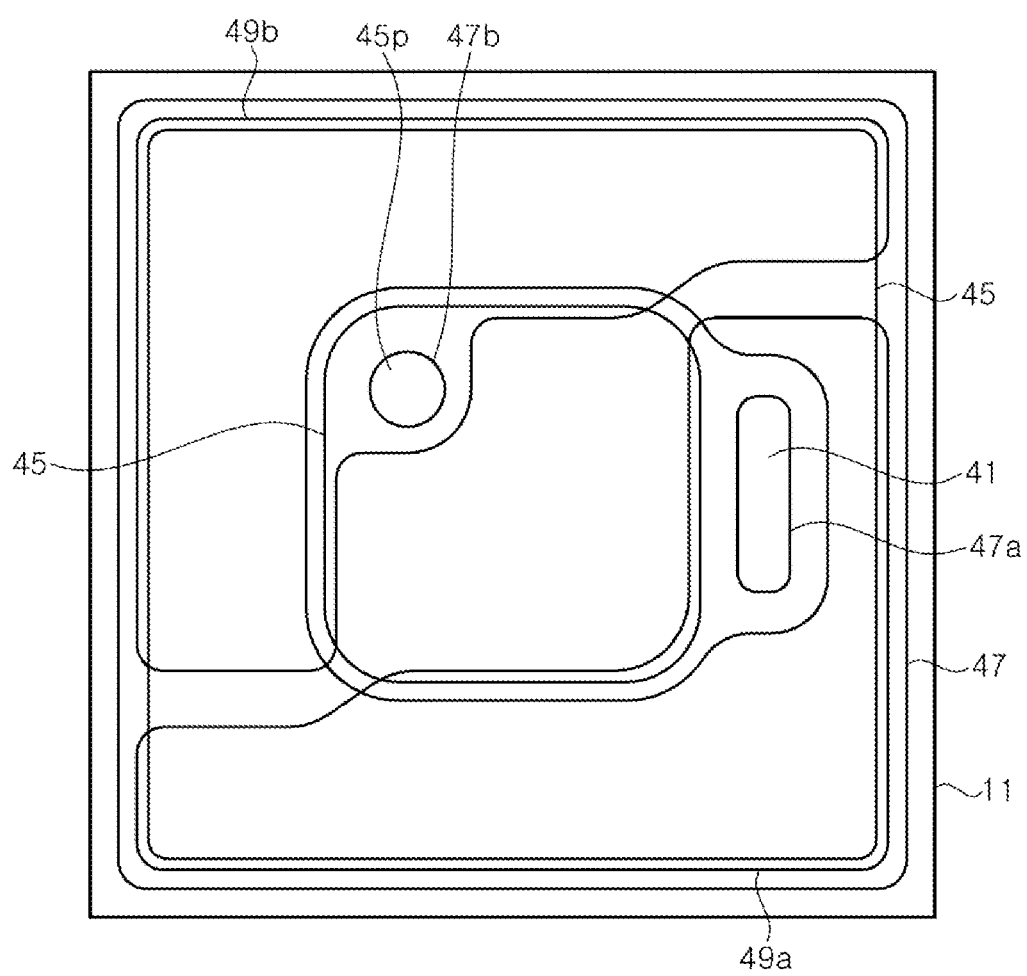
FIG. 3A is a schematic plan view as viewed on a third LED stack to illustrate a light emitting device according to an exemplary embodiment.
Figure 3B:
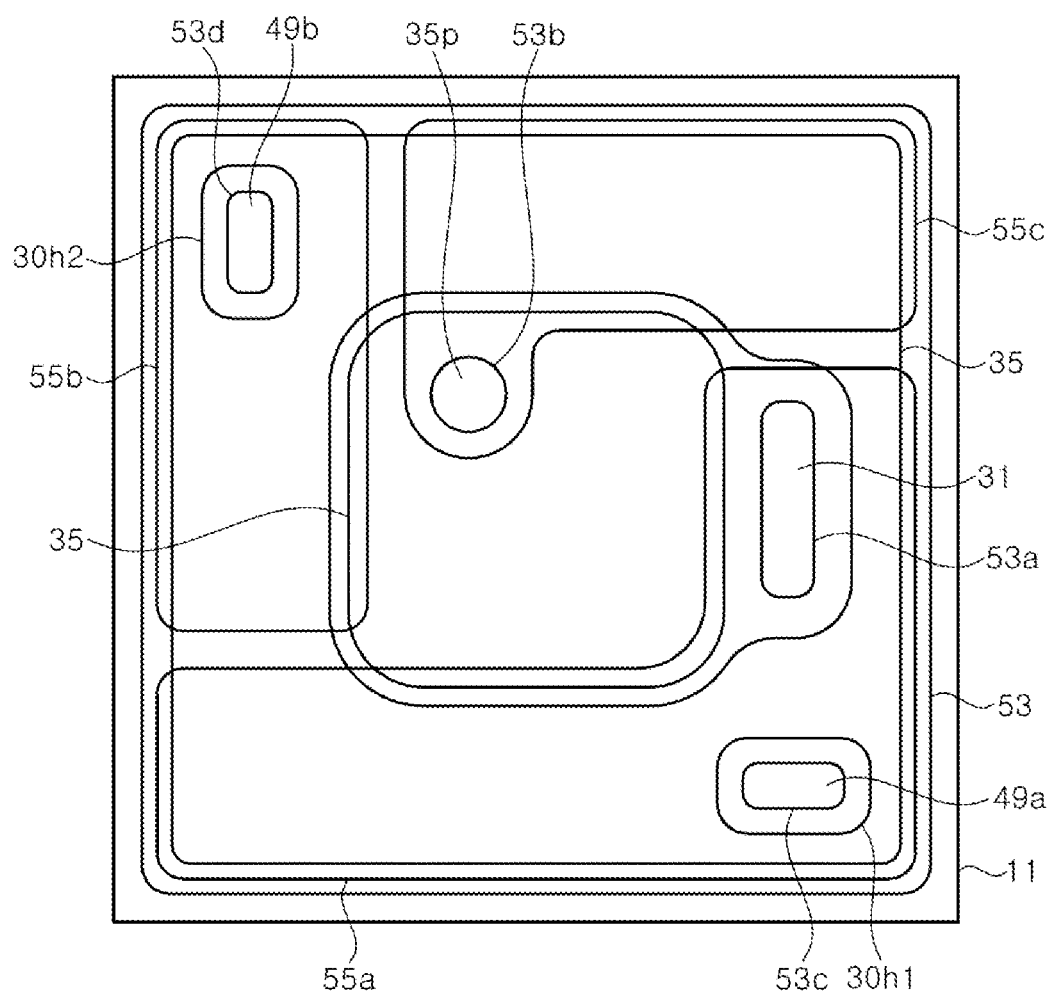
FIG. 3B is a schematic plan view as viewed on a second LED stack to illustrate a light emitting device according to an exemplary embodiment.
Figure 3C:
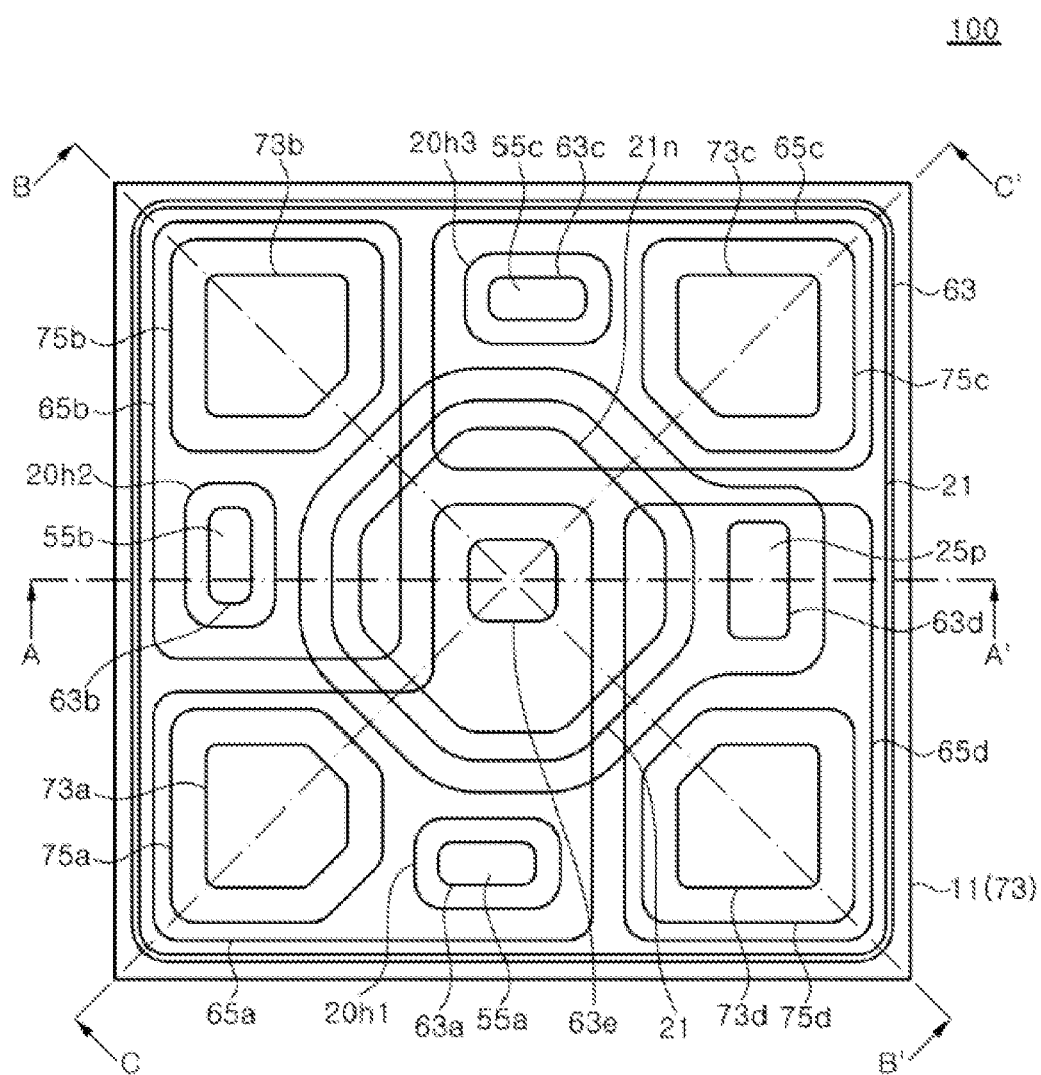
FIG. 3C is a schematic plan view as viewed on a first LED stack to illustrate a light emitting device according to an exemplary embodiment.
Figure 4A:
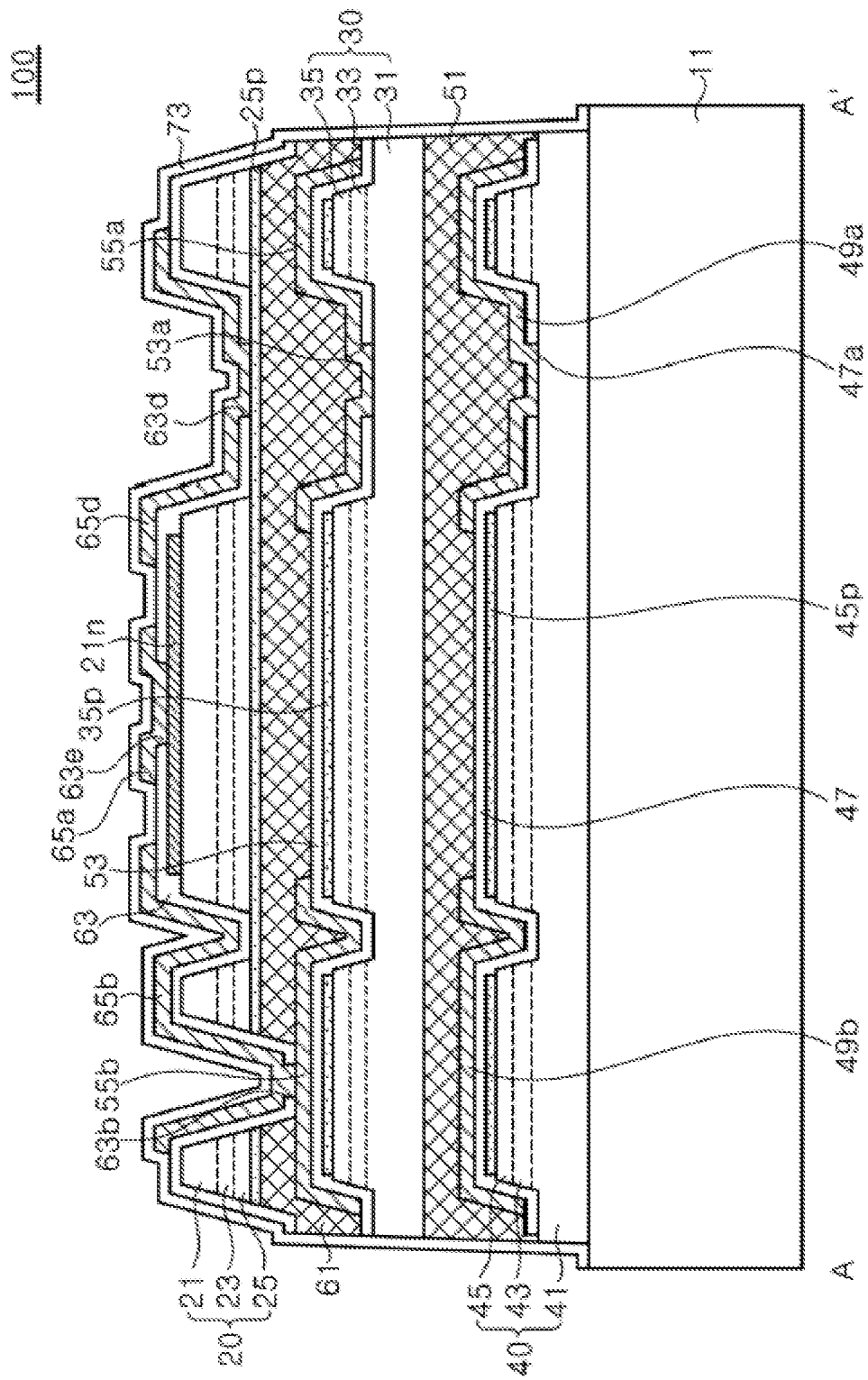
FIG. 4A is a schematic cross-sectional view taken along line A-A'.
Figure 4B:
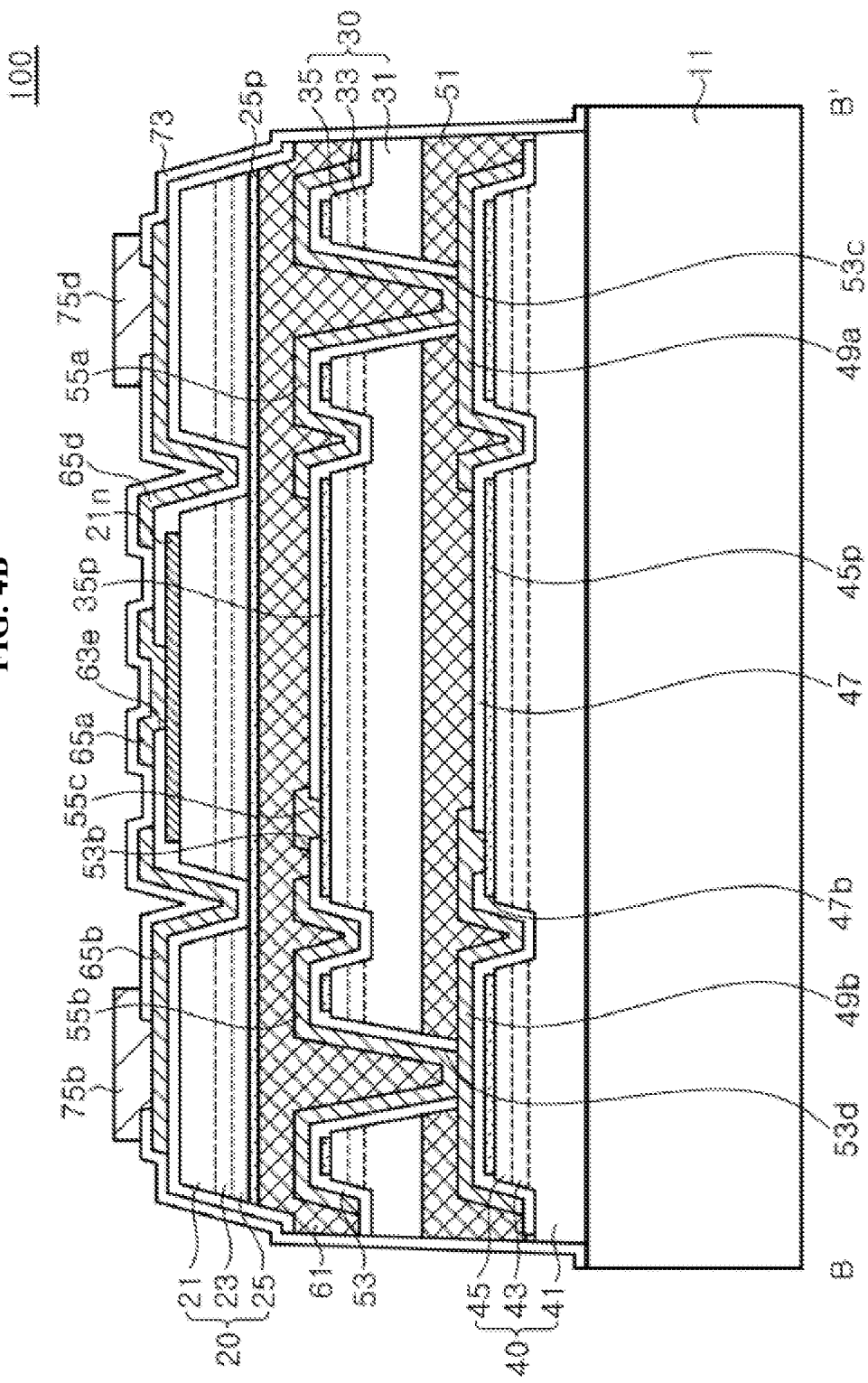
FIG. 4B is a schematic cross-sectional view taken along line B-B' of FIG. 3C.
Figure 4C:
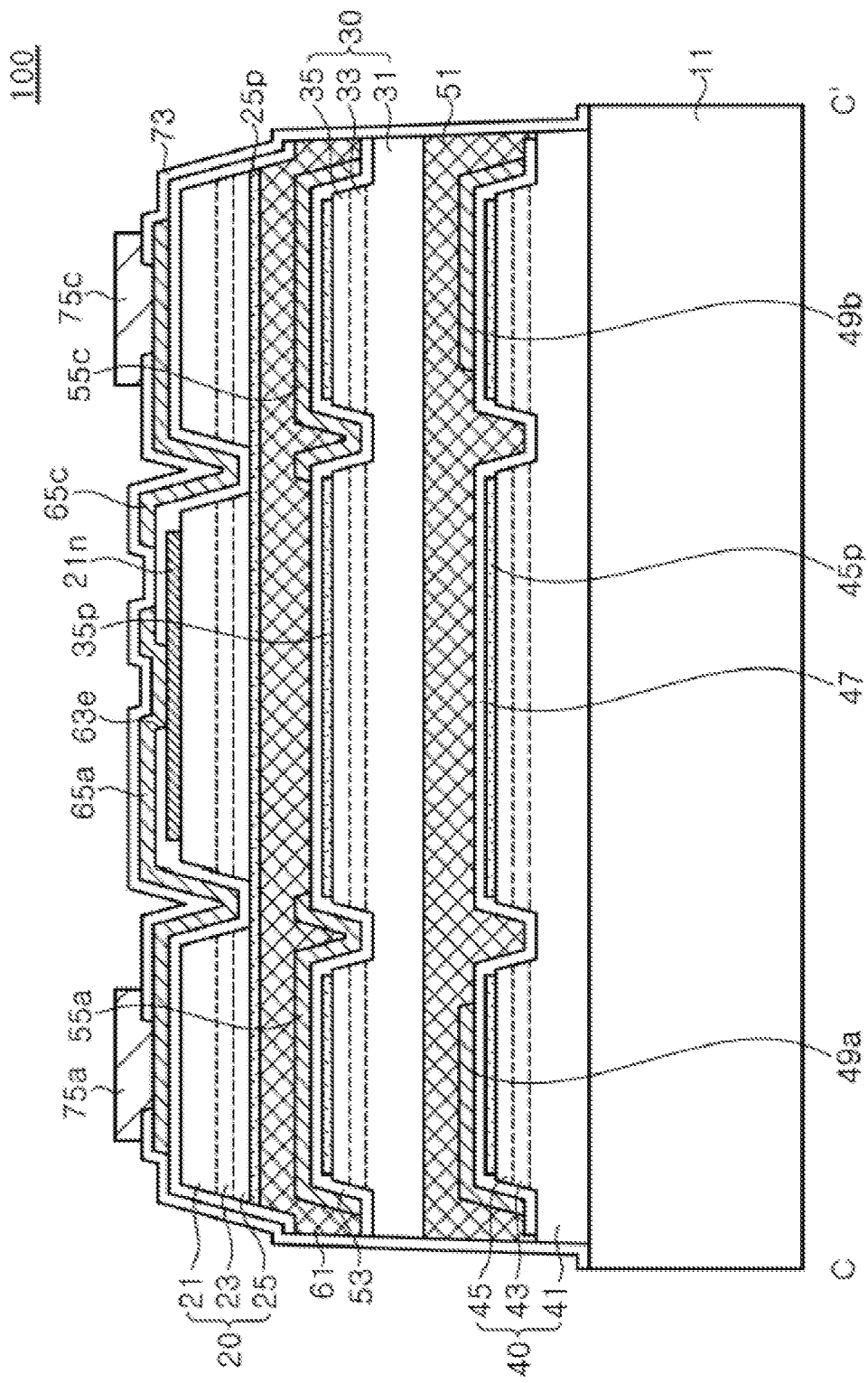
FIG. 4C is a schematic cross-sectional view taken along line C-C' of FIG. 3C.

A specific configuration of the light emitting device 100 will be described in detail below. FIGS. 3A, 3B, and 3C are schematic plan views illustrating the light emitting device 100 according to an exemplary embodiment. FIG. 3A is a schematic plan view as viewed on a third LED stack, FIG. 3B is a schematic plan view as viewed on a second LED stack, and FIG. 3C is a schematic plan view as viewed on a first LED stack. FIGS. 4A, 4B, and 4C are schematic cross-sectional views taken along lines A-A', B-B', and C-C' of FIG. 3C, respectively.

Referring to FIGS. 3A, 3B, 3C, 4A, 4B, and 4C, the light emitting device 100 according to an exemplary embodiment may include a substrate 11, a first LED stack 20, a second LED stack 30, a third LED stack 40, a first transparent electrode 25p, a second transparent electrode 35p, a third transparent electrode 45p, a first ohmic electrode 21n, a first adhesive layer 51, a second adhesive layer 61, insulation layers 47, 53, 63, and 73, connectors 49a, 49b, 55a, 55c, 65a, and 65d, intermediary connectors 55b, 65b, and 65c, and bump pads 75a, 75b, 75c, and 75d.

As one example, the light emitting device 100 may have an area of 500 μm×500 μm or less. As another example, the area of the light emitting device 100 may be 300 μm×300 μm or less. As further another example, the area of the light emitting device 100 may be 200 μm×200 μm or less. A micro LED generally refers to a light emitting device having a lateral area of 100 μm×100 μm or less. However, the light emitting device 100 according to the exemplary embodiment may have an area larger than 100 μm×100 μm. Meanwhile, the light emitting device 100 includes a light generation region and a peripheral region. The light generation region emits light suitable for implementing an image, and the peripheral region does not substantially generate light. Herein, the light generation region may have a size suitable for being referred to as the micro LED, that is, an area of 100 μm×100 μm or less. As another example, the size of the light generation region may have a size of 60 μm×60 μm or less. The light generation region may have an area of, for example, 20% or less, and further, 10% or less of an area of the light emitting device 100. As the size of the light emitting device 100 is set to be relatively large while the size of the light generation region is reduced, handling of the light emitting device 100 may be assisted, and further, the current density in the light generation region may be increased, thereby increasing the external quantum efficiency of the light emitting device.

The substrate 11 may be a transparent substrate capable of transmitting light. In some exemplary embodiments, the substrate 11 may be formed to transmit light of a selected specific wavelength or to transmit a portion of light of a specific wavelength. The substrate 11 may be a growth substrate to grow a semiconductor layer, and for example, may be a growth substrate used for epitaxial growth of the third LED stack 40, for example, a sapphire substrate. The substrate 11 is not limited to a growth substrate or a sapphire substrate and may include various other transparent substrates. For example, the substrate 11 may include glass, quartz, silicon, an organic polymer, or an organic-inorganic composite material, and examples thereof may include silicon carbide (SiC), gallium nitride (GaN), indium gallium nitride (InGaN), aluminum gallium nitride (AlGaN), aluminum nitride (AlN), gallium oxide (Ga2O3), or a silicon substrate. Further, the substrate 11 may include irregularities on an upper surface thereof, and may be, for example, a patterned sapphire substrate. By including the irregularities on the upper surface of the substrate 11, it is possible to increase extraction efficiency of light generated in the third light emitting stack 40 which is in contact with the substrate 11. The irregularities of the substrate 11 may be included to selectively increase luminous intensity of the third light emitting stack 40 compared to those of the first light emitting stack 20 and the second light emitting stack 30. In another exemplary embodiment, the substrate 11 may be removed. When the substrate 11 is removed, the substrate 11 is not required to be a transparent substrate.

The first, second, and third LED stacks 20, 30, and 40 are configured to emit light towards the substrate 11. Accordingly, light emitted from the first LED stack 20 may pass through the second and third LED stacks 30 and 40. According to an exemplary embodiment, the first, second, and third LED stacks 20, 30, and 40 may emit light having different peak wavelengths from one another. In an exemplary embodiment, an LED stack far from the substrate 11 may reduce light loss by emitting light of a longer wavelength compared to an LED stack close to the substrate 11. For example, the first LED stack 20 may emit red light, the second LED stack 30 emits green light, and the third LED stack 40 may emit blue light.

In another exemplary embodiment, the second LED stack 30 may emit light of a shorter wavelength than that of the third LED stack 40. As such, it is possible to reduce a luminous intensity of the second LED stack 30 and increase a luminous intensity of the third LED stack 40, and by using this, a luminous intensity ratio of light emitted from the first, second, and third LED stacks 20, 30, 40 may be adjusted. For example, the first LED stack 20 may be configured to emit red light, the second LED stack 30 may be configured to emit blue light, and the third LED stack 40 may be configured to emit green light. Accordingly, a luminous intensity of blue light may be relatively reduced and a luminous intensity of green light may be relatively increased, and thus, the luminous intensity ratio of red, green, and blue light may be easily adjusted to be close to, for example, 3:6:1.

Hereinafter, it is exemplarily described that the second light emitting stack 30 emits light of a shorter wavelength than that of the third light emitting stack 40, such as blue light. However, it should be noted that the second light emitting stack 30 emits light of a longer wavelength than that of the third light emitting stack 40, such as green light.

The first light emitting stack 20 includes a first conductivity type semiconductor layer 21, an active layer 23, and a second conductivity type semiconductor layer 25. According to an exemplary embodiment, the first light emitting stack 20 may include a semiconductor material such as AlGaAs, GaAsP, AlGaInP, and GaP that emits red light, but the inventive concepts are not limited thereto.

The first LED stack 20 includes a light generation region and a peripheral region. Both the light generation region and the peripheral region may include the first conductivity type semiconductor layer 21, the active layer 23, and the second conductivity type semiconductor layer 25. An upper surface of the light generation region may be disposed at a same elevation as that of the peripheral region. However, the light generation region is configured to generate light in the active layer 23, but the peripheral region is not required to generate light in the active layer 23, and furthermore, substantially does not generate light. In an exemplary embodiment, the peripheral region may surround the light generation region and may be separated from the light generation region. For example, the peripheral region may be separated from the light generation region by a groove formed around the light generation region. In addition, the groove may expose the first transparent electrode 25p.

As shown in FIG. 4A, the first ohmic electrode 21n may be disposed on the first conductivity type semiconductor layer 21 in the light generation region and may form an ohmic contact with the first conductivity type semiconductor layer 21. The first ohmic electrode 21n may have a single layer structure or a multiple layer structure, and may include Al, Ti, Cr, Ni, Au, Ag, Sn, W, Cu, or alloys thereof such as Au—Te alloy or Au—Ge alloy, but the inventive concepts are not limited thereto. In an exemplary embodiment, the first ohmic electrode 21n may have a thickness of about 100 nm, and may include a metal having high reflectivity to increase light emission efficiency in a downward direction toward the substrate 11.

In an exemplary embodiment, a portion of the first conductivity type semiconductor layer 21 in the light generation region may be patterned and recessed, and the first ohmic electrode 21n may be disposed in a recessed region of the first conductivity type semiconductor layer 21 to increase an ohmic contact level.

The first transparent electrode 25p may be in ohmic contact with the second conductivity type semiconductor layer 25. The first transparent electrode 25p may be disposed under the second conductivity type semiconductor layer 25. As shown in FIG. 4A, a portion of the first transparent electrode 25p may extend in a lateral direction from the lower surface of the light generation region. In addition, as shown in FIGS. 4A, 4B, and 4C, the first transparent electrode 25p may contact the second conductivity type semiconductor layer 25 in not only the light generation region but also in the peripheral region. However, the inventive concepts are not limited thereto, and the first transparent electrode 25p may not contact the second conductivity type semiconductor layer 25 of the peripheral region. The first transparent electrode 25p may be formed of a material layer that transmits light generated in the first LED stack 20.

The second LED stack 30 includes a first conductivity type semiconductor layer 31, an active layer 33, and a second conductivity type semiconductor layer 35. In an exemplary embodiment, the second LED stack 30 may include a semiconductor material emitting blue light such as GaN, InGaN, ZnSe, or the like, but the inventive concepts are not limited thereto. The second LED stack 30 may also include a light generation region and a peripheral region. The peripheral region may surround the light generation region. The active layer 33 and the second conductivity type semiconductor layer 35 in the peripheral region may be separated from the active layer 33 and the second conductivity type semiconductor layer 35 in the light generation region by a mesa etching region. However, the first conductivity type semiconductor layer 31 in the peripheral region and the first conductivity type semiconductor layer 31 in the light generation region may be connected to each other.

The first conductivity type semiconductor layer 31 may be exposed by the mesa etching region between the peripheral region and the light generation region. The mesa etching region may be formed to surround the light generation region. For example, a mesa including the active layer 33 and the second conductivity type semiconductor layer 35 may be formed on the first conductivity type semiconductor layer 31 by the mesa etching region, the light generation region may be defined by the mesa, and an upper surface of the first conductivity type semiconductor layer 31 around the mesa may be exposed.

Meanwhile, a side surface of the peripheral region surrounding the light generation region may be inclined with respect to a vertical surface. The inclined side surface of the peripheral region of the second LED stack 30 reflects incident light generated in the first LED stack 20 toward the substrate 11 to improve light extraction efficiency. In addition, an outer side of the peripheral region may also be inclined with respect to the vertical surface. The outer side surface of the peripheral region may also be inclined with respect to the vertical surface. The first conductivity type semiconductor layer 31 may be exposed by the mesa etching region around the outer side surface of the peripheral region.

The second transparent electrode 35p is disposed on the second conductivity type semiconductor layer 35 of the second LED stack 30. As shown in FIGS. 4A, 4B, and 4C, the second transparent electrode 35p may be disposed not only on the light generation region but also on the peripheral region. However, the second transparent electrode 35p disposed on the light generation region may be electrically insulated from the second transparent electrode 35p disposed on the peripheral region. Furthermore, the second transparent electrode 35p may be disposed limitedly on the light generation region. The second transparent electrode 35p may be formed of a material layer that transmits light generated in the first LED stack 20.

The third LED stack 40 includes a first conductivity type semiconductor layer 41, an active layer 43, and a second conductivity type semiconductor layer 45. According to an exemplary embodiment, the third LED stack 40 may include a semiconductor material emitting green light such as GaN, InGaN, GaP, AlGaInP, AlGaP, or the like, but the inventive concepts are not limited thereto. The third LED stack 40 may also include a light generation region and a peripheral region, and the peripheral region may surround the light generation region. The active layer 43 and the second conductivity type semiconductor layer 45 in the peripheral region may be separated from the active layer 43 and the second conductivity type semiconductor layer 45 in the light generation region by the mesa etching region. However, the first conductivity type semiconductor layer 41 in the peripheral region and the first conductivity type semiconductor layer 41 in the light generation region may be connected to each other.

The first conductivity type semiconductor layer 41 may be exposed by the mesa etching region between the peripheral region and the light generation region. The mesa etching region may be formed to surround the light generation region. For example, a mesa including the active layer 43 and the second conductivity type semiconductor layer 45 may be formed on the first conductivity type semiconductor layer 41 by the mesa etching region, the light generation region may be defined by the mesa, and an upper surface of the first conductivity type semiconductor layer 41 around the mesa may be exposed.

Meanwhile, a side surface of the peripheral region surrounding the light generation region may be inclined with respect to a vertical surface. The inclined side surface of the peripheral region of the third LED stack 40 reflects incident light generated in the first and second LED stacks 20 and 30 toward the substrate 11 to improve light extraction efficiency. In addition, an outer side surface of the peripheral region may be inclined with respect to the vertical surface. The outer side surface of the peripheral region may also be inclined with respect to the vertical surface. The first conductivity type semiconductor layer 41 may be exposed by the mesa etching region around the outer side surface of the peripheral region.

The third transparent electrode 45p is disposed on the second conductivity type semiconductor layer 45 of the third LED stack 40. As shown in FIGS. 4A, 4B, and 4C, the third transparent electrode 45p may be disposed not only on the light generation region but also on the peripheral region. However, the third transparent electrode 45p disposed on the light generation region may be electrically insulated from the third transparent electrode 45p disposed on the peripheral region. Furthermore, the third transparent electrode 45p may be disposed limitedly on the light generation region. The third transparent electrode 45p may be formed of a material layer that transmits light generated in the first and second LED stacks 20 and 30.

According to an exemplary embodiment, each of the first conductivity type semiconductor layers 21, 31, and 41 and the second conductivity type semiconductor layer 25, 35, and 45 of the first, second, and third LED stacks 20, 30, and 40 may have a single layer structure or a multiple layer structure, and in some exemplary embodiments, may include a superlattice layer. Moreover, the active layers 23, 33, and 43 of the first, second, and third LED stacks 20, 30, and 40 may have a single quantum well structure or a multiple quantum well structure.

Meanwhile, the light generation regions of the first, second, and third LED stacks 20, 30, and 40 may be at least partially overlapped with one another. As shown in FIGS. 3A, 3B, and 3C, the light generation regions of the first, second, and third LED stacks 20, 30, and 40 may be overlapped with one another by about 50% or more, further, 70% or more, and furthermore, about 90% or more.

Meanwhile, as shown in FIGS. 3A, 3B, and 3C, the light generation regions of the second LED stack 30 and the third LED stack 40 may have a substantially same shape, and may be arranged while maintaining a same arrangement direction. On the contrary, the light generation region of the first LED stack 20 may have a shape different from those of the light generation regions of the second LED stack 30 and the third LED stack 40, and even when they have similar shapes, they may be arranged in different arrangement directions. For example, in FIGS. 3A, 3B, and 3C, the light generation regions of the second and third LED stacks 30 and 40 have a quadrangular shape and are arranged in the same arrangement direction with each other, but the light generation region of the first LED stack 20 is arranged in the arrangement direction rotated by approximately 45 degrees with respect to the arrangement direction of the second and third LED stacks 30 and 40. Furthermore, the light generation region of the first LED stack 20 has a chamfered shape.

Areas of the pads 75a, 75b, 75c, and 75d may be increased by rotating the arrangement direction of the light generation region of the first LED stack 20 by 45 degrees, and further, it is possible to reduce blocking of light emitted from the light generation region of the first LED stack 20 by other light blocking layers on the path where it is emitted to the outside. For example, by arranging the light generation region of the first LED stack 20 as shown in FIG. 3C, it is possible to reduce blocking of light generated in the first LED stack 20 by a third-2 connector 49b or a second-2 connector 55c which will be described later.

Each of the first, second, and third transparent electrodes 25p, 35p, and 45p may include a transparent conductive material that transmits light. For example, the first, second, and third transparent electrodes 25p, 35p, and 45p may include a transparent conductive oxide (TCO), such as SnO, InO2, ZnO, ITO, ITZO, or the like, but the inventive concepts are not limited thereto.

The first adhesive layer 51 is disposed between the second LED stack 30 and the third LED stack 40, and the second adhesive layer 61 is disposed between the first LED stack 20 and the second LED stack 30. The first and second adhesive layers 51 and 61 may include a non-conductive material that transmits light. For example, the first and second adhesive layers 51 and 61 may include an optically transparent adhesive (OCA), for example, epoxy, polyimide, SU8, spin-on-glass (SOG), or benzocyclobutene (BCB), but the inventive concepts are not limited thereto.

The first insulation layer 47 covers the third LED stack 40. As shown in FIGS. 3A, 4A, and 4B, the first insulation layer 47 may have an opening 47a exposing the first conductivity type semiconductor layer 41 near the light generation region of the third LED stack 40 and an opening 47b exposing the third transparent electrode 45p on the light generation region. In addition, as shown in FIGS. 3A and 4A, the first insulation layer 47 may cover side surfaces of the third transparent electrode 45p, the second conductivity type semiconductor layer 45, and the active layer 43 along an edge of the peripheral region. Furthermore, the first insulation layer 47 may at least partially cover the upper surface of the first conductivity type semiconductor layer 41 exposed around the peripheral region.

As shown in FIG. 4A, the third-1 connector 49a and the third-2 connector 49b are disposed on the first insulation layer 47. The third-1 connector 49a and the third-2 connector 49b are electrically connected to the first conductivity type semiconductor layer 41 and the second conductivity type semiconductor layer 45 in the light generation region, respectively. For example, the third-1 connector 49a may be electrically connected to the first conductivity type semiconductor layer 41 through the opening 47a, and the third-2 connector 49b may be electrically connected to the third transparent electrode 45p through the opening 47b.

As shown in FIGS. 3A, 4A, 4B, and 4C, the third-1 connector 49a and the third-2 connector 49b are formed so as to cover the outer side surface of the peripheral region. That is, the third-1 connector 49a and the third-2 connector 49b cover the first insulation layer 47 covering the outer side surface of the peripheral region, respectively. However, the third-1 connector 49a and the third-2 connector 49b may be spaced apart from the first conductivity type semiconductor layer 31 exposed around the peripheral region. In the illustrated exemplary embodiment, although each of the third-1 connector 49a and the third-2 connector 49b is shown as covering the outer side surface of the peripheral region substantially similarly, the inventive concepts are not limited thereto. For example, any one of the third-1 connector 49a and the third-2 connector 49b may cover more of the side surface of the peripheral region than the other one, and furthermore, the other one may be spaced apart from the side surface of the peripheral region in a lateral direction.

In at least one variant, the third-1 connector 49a and the third-2 connector 49b may cover 80% or more, additionally, 90% or more, further additionally 95% or more of the side surface of the peripheral region. Since the third-1 connector 49a and the third-2 connector 49b cover the outer side surface of the peripheral region, it is possible to block light emitted through the side surface of the peripheral region, for example, the side surface of the active layer 43 and that of the second conductivity type semiconductor layer 45. In particular, the third-1 connector 49a and the third-2 connector 49b may include a metal reflection layer such as Al, and thus, light toward a side surface of the third LED stack 40 may be reflected and light emitted through the substrate 11 may be increased.

Further, the third-1 connector 49a and the third-2 connector 49b may be mostly disposed over the peripheral region, but they may be disposed to cover most of the side surface of the light generation region. For example, as shown in FIG. 3A, the third-1 connector 49a may cover the side surface close to almost half of the side surface of the light generation region, and the third-2 connector 49b may also cover the side surface close to almost half of the side surface of the light generation region. The third-1 connector 49a and the third-2 connector 49b may cover 80% or more, additionally 90% or more, and further additionally 95% or more of an entire side surface region of the light generation region. As such, it is possible to dramatically reduce light generated in the active layer 43 of the light generation region from being emitted through the side surface of the light generation region, thereby narrowing a viewing angle of light emitted from the third LED stack 40.

In the illustrated exemplary embodiment, each of the third-1 connector 49a and the third-2 connector 49b may substantially similarly cover the side surface of the light generation region. However, the inventive concepts are not limited thereto, and any one of the third-1 connector 49a and the third-2 connector 49b may cover a larger region than the other one. Furthermore, any one of the third-1 connector 49a and the third-2 connector 49b may cover the side surface of the light generation region and the other one may be spaced apart from the side surface of the light generation region in the lateral direction.

Meanwhile, as shown in FIG. 3B, the second LED stack 30 may include through holes 30h1 and 30h2 passing through the peripheral region. The through holes 30h1 and 30h2 pass through the first adhesive layer 51 to expose the third-1 connector 49a and the third-2 connector 49b, respectively.

The second insulation layer 53 covers the second LED stack 30. As shown in FIGS. 3B and 4A, the second insulation layer 53 may have an opening 53a exposing the first conductivity type semiconductor layer 31 near the light generation region of the second LED stack 30 and an opening 53b (FIG. 4B) exposing the second transparent electrode 35p on the light generation. Further, as shown in FIGS. 3B and 4B, the second insulation layer 53 may have openings 53c and 53d exposing the third-1 connector 49a and the third-2 connector 49b in the through holes 30h1 and 30h2. In addition, as shown in FIGS. 3B and 4A, the second insulation layer 53 may cover a side surface of the second transparent electrode 35p and the outer side surface of the peripheral region, and may at least partially cover the exposed first conductivity type semiconductor layer 31 around the peripheral region.

The second-1 connector 55a, the second intermediary connector 55b, and the second-2 connector 55c may be disposed on the second insulation layer 53. As shown in FIG. 3B, the second-1 connector 55a, the second intermediary connector 55b, and the second-2 connector 55c are disposed apart from one another on the same plane.

The second-1 connector 55a and the second-2 connector 55c are electrically connected to the first conductivity type semiconductor layer 31 and the second conductivity type semiconductor layer 35 in the light generation region, respectively. For example, the second-1 connector 55a may be electrically connected to the first conductivity type semiconductor layer 31 through the opening 53a, and the second-2 connector 55c may be electrically connected to the second transparent electrode 35p through the opening 53b.

Further, as shown in FIGS. 3B and 4B, the second-1 connector 55a may be electrically connected to the third-1 connector 49a through the through hole 30h1 and the opening 53c, and the second intermediary connector 55b may be electrically connected to the third-2 connector 49b through the through hole 30h2 and the opening 53d.

At least one of the second-1 connector 55a, the second intermediary connector 55b, and the second-2 connector 55c may be formed to cover the side surface of the peripheral region of the second LED stack 30. That is, the second-1 connector 55a, the second intermediary connector 55b, and the second-2 connector 55c may cover the second insulation layer 53 covering the side surface of the peripheral region. However, the second-1 connector 55a, the second intermediary connector 55b, and the second-2 connector 55c may be spaced apart from the first conductivity type semiconductor layer 31 exposed around the peripheral region.

The second-1 connector 55a, the second intermediary connector 55b, and the second-2 connector 55c may cover 80% or more, further 90% or more, furthermore 95% or more of the side surface of the peripheral region. Since the second-1 connector 55a, the second intermediary connector 55b, and the second-2 connector 55c cover the outer side surface of the peripheral region, it is possible to block light emitted through the side surface of the peripheral region, for example, the side surface of the active layer 33 and that of the second conductivity type semiconductor layer 35. In particular, the second-1 connector 55a, the second intermediary connector 55b, and the second-2 connector 55c may include a metal reflection layer such as Al, and thus, light toward a side surface of the third LED stack 30 may be reflected and light emitted through the substrate 11 may be increased. Accordingly, the second-1 connector 55a, the second intermediary connector 55b, and the second-2 connector 55c operate to guide light to be collected and emitted through the substrate 11.

Further, the second-1 connector 55a, the second intermediary connector 55b, and the second-2 connector 55c may be mostly disposed over the peripheral region, but they may be disposed to cover most of the side surface of the light generation region. For example, as shown in FIG. 3B, the second-1 connector 55a may cover the side surface close to almost half of the side surface of the light generation region, and the second intermediary connector 55b and the second-2 connector 55c may cover the side surface close to almost ¼ of the side of the light generation region, respectively. The second-1 connector 55a, the second intermediary connector 55b, and the second-2 connector 55c may cover 80% or more, additionally 90% or more, and further additionally 95% or more of the entire side surface region of the light generation region. As such, it is possible to dramatically reduce light generated in the active layer 33 of the light generation region from being emitted through the side surface of the light generation region, thereby narrowing a viewing angle of light emitted from the second LED stack 30.

In the illustrated exemplary embodiment, although the second-1 connector 55a is shown and described as covering more of the side surface of the light generation region than the second intermediary connector 55b and the second-2 connector 55c, the inventive concepts are not limited thereto. Various methods for covering the side surface of the light generation region using the second-1 connector 55a, the second intermediary connector 55b, and the second-2 connector 55c may be designed.

In the illustrated exemplary embodiment, the opening 53b of the second insulation layer 53 may be formed to be overlapped with the opening 47b of the first insulation layer 47. Accordingly, a portion where the second-2 connector 55c is connected to the second transparent electrode 35p may be overlapped with a portion where the third-2 connector 49b is connected to the third transparent electrode 45p. Accordingly, a region covered with the second-2 connector 55c and the third-2 connector 49b among the light generation regions may be reduced.

Meanwhile, as shown in FIG. 3C, the first LED stack 20 may include through holes 20h1, 20h2, and 20h3 in the peripheral region. The through holes 20h1, 20h2, and 20h3 may pass through the second adhesive layer 61 to expose the second-1 connector 55a, the second intermediary connector 55b, and the second-2 connector 55c, respectively.

The third insulation layer 63 covers the first LED stack 20. As shown in FIGS. 3C and 4B, the third insulation layer 63 may have openings 63a, 63b, and 63c exposing the second-1 connector 55a, the second intermediary connector 55b, and the second 2 connector 55c in the through holes 20h1, 20h2, and 20h3. Further, the third insulation layer 63 may have an opening 63d exposing the first transparent electrode 25p near the light generation region of the first LED stack 20 and an opening 63e exposing the first ohmic electrode 21n on the light generation region. Moreover, as shown in FIGS. 3C and 4A, the third insulation layer 63 may cover the side surface of the peripheral region. The third insulation layer 63 may cover the side surface of the first transparent electrode 25p along with the side surface of the peripheral region, and further, may partially cover a side surface of the second adhesive layer 61.

According to the illustrated exemplary embodiment, at least one of the first insulation layer 47, the second insulation layer 53, and the third insulation layer 63 may include various organic or inorganic insulating materials, such as polyimide, $SiO_2$, $SiN_x$, $Al_2O_3$, or the like. At least one of the first, second, and third insulation layers 47, 53, and 63 may have a single layer structure or a multiple layer structure formed of two or more insulation layers having different refractive indices from one another. For example, the third insulation layer 63 may include a distributed Bragg reflector (DBR).

The first-1 connector 65a, the first-1 intermediary connector 65b, the first-2 intermediary connector 65c, and the first-2 connector 65d are disposed on the third insulation layer 63. As shown in FIG. 3C, the first-1 connector 65a, the first-1 intermediary connector 65b, the first-2 intermediary connector 65c, and the first-2 connector 65d are disposed apart from one another on the same plane. As shown in FIG. 3C, the first-1 connector 65a, the first-1 intermediary connector 65b, the first-2 intermediary connector 65c, and the first-2 connector 65d may be disposed to cover most of the side surface of the light generation region of the first LED stack 20. For example, the first-1 connector 65a, the first-1 intermediary connector 65b, the first-2 intermediary connector 65c, and the first-2 connector 65d may cover 80% or more, additionally 90% or more, and further additionally 95% or more of the side surface of the light generation region. The first-1 connector 65a, the first-1 intermediary connector 65b, the first-2 intermediary connector 65c, and the first-2 connector 65d may cover the side surface of the light generation region to reduce a viewing angle of light emitted from the first LED stack 20. Furthermore, the first-1 connector 65a, the first-1 intermediary connector 65b, the first-2 intermediary connector 65c, and the first-2 connector 65d may include a metal reflection layer such as Al and thus, light efficiency may be improved.

The first-1 connector 65a and the first-2 connector 65d are electrically connected to the first conductivity type semiconductor layer 21 and the second conductivity type semiconductor layer 25 in the light generation region, respectively. For example, the first-1 connector 65a may be electrically connected to the first ohmic electrode 21n through the opening 63e, and the first-2 connector 65d may be electrically connected to the first transparent electrode 25p through the opening 63d.

Further, the first-1 connector 65a may be electrically connected to the second-1 connector 55a through the through hole 20h1 and the opening 63a, the first-1 intermediary connector 65b may be electrically connected to the second intermediary connector 55b through the through hole 20h2 and the opening 63b, and the first-2 intermediary connector 65c may be electrically connected to the second-2 connector 55c through the through hole 20h3 and the opening 63c.

The protection insulation layer 73 covers the first-1 connector 65a, the first-1 intermediary connector 65b, the first-2 intermediary connector 65c, and the first-2 connector 65d. The protection insulation layer 73 may also cover the third insulation layer 63, and may cover side surfaces of the second adhesive layer 61, the first conductivity type semiconductor layer 31 of the second LED stack 30, the first adhesive layer 51, and the first conductivity type semiconductor layer 41 of the third LED stack 40. The protection insulation layer 73 includes openings 73a, 73b, 73c, and 73d exposing the first-1 connector 65a, the first-1 intermediary connector 65b, the first-2 intermediary connector 65c, and the first-2 connector 65d, respectively. The openings 73a, 73b, 73c, and 73d are located on the peripheral region of the first LED stack 20.

As shown in FIG. 3C, the bump pads 75a, 75b, 75c, and 75d may be electrically connected to the first-1 connector 65a, the first-1 intermediary connector 65b, the first-2 intermediary connector 65c, and the first-2 connector 65d through the openings 73a, 73b, 73c, and 73d, respectively. The bump pads 75a, 75b, 75c, and 75d may cover the openings 73a, 73b, 73c, and 73d, respectively.

The first bump pad 75a may be disposed on the first-1 connector 65a, and may be electrically connected to the first-1 connector 65a, the second-1 connector 55a, and the third-1 connector 49a. As such, the first bump pad 75a may be commonly electrically connected to the first conductivity type semiconductor layer 21 of the first LED stack 20, the first conductivity type semiconductor layer 31 of the second LED stack 30, and the first conductivity type semiconductor layer 41 of the third LED stack 40.

The second bump pad 75b may be disposed on the first-1 intermediary connector 65b, and may be electrically connected to the second conductivity type semiconductor layer 45 of the third LED stack 40 through the first-1 intermediary connector 65b, the second intermediary connector 55b, and the third-2 connector 49b.

The third bump pad 75c may be disposed on the first-2 intermediary connector 65c, and may be electrically connected to the second conductivity type semiconductor layer 35 of the second LED stack 30 through the first-2 intermediary connector 65c and the second-2 connector 55c.

The fourth bump pad 75d may be disposed on the first-2 connector 65d, may be electrically connected to the first transparent electrode 25p through the first-2 connector 65d, and, accordingly, may be electrically connected to the second conductivity type semiconductor layer 25 of the first LED stack 20.

That is, the first LED stack 20 is electrically connected between the first bump pad 75a and the fourth bump pad 75d, the second LED stack 30 is electrically connected between the first bump pad 75a and the third bump pad 75c, and the third LED stack 40 is electrically connected between the first bump pad 75a and the second bump pad 75b. As such, the first, second, and third LED stacks 20, 30, and 40 may be independently driven.

Since all of the bump pads 75a, 75b, 75c, and 75d are disposed on the flat first LED stack 20, all of the bump pads 75a, 75b, 75c, and 75d may be located at substantially an identical elevation. Moreover, as shown in FIG. 3C, since the bump pads 75a, 75b, 75c, and 75d may be limitedly disposed on the peripheral region of the first LED stack 20, the bump pads 75a, 75b, 75c, and 75d may be easily formed, and further, stability thereof may be improved. The bump pads 75a, 75b, 75c, and 75d may be disposed to be spaced apart from the light generation regions of the first, second, and third LED stacks 20, 30, and 40 in the lateral direction, and may be disposed near an edge of the light emitting device 100 as shown in FIG. 3C. However, the inventive concepts are not necessarily limited thereto.

The bump pads 75a, 75b, 75c, and 75d may be formed using, for example, Au or Au/In, but the inventive concepts are not limited thereto. Moreover, since the bump pads 75a, 75b, 75c, and 75d are disposed on the first LED stack 20, they may be formed relatively thinner than when the bump pads 75a, 75b, 75c, and 75d are disposed on the substrate 11 or the third LED stack 40. Accordingly, selectivity for a process of forming the bump pads 75a, 75b, 75c, and 75d is improved. For example, the bump pads 75a, 75b, 75c, and 75d may be easily formed by electroplating.

Herein, the first conductivity type semiconductor layers 21, 31, and 41 may be n-type semiconductor layers, and the second conductivity type semiconductor layers 25, 35, and 45 may be p-type semiconductor layers. Accordingly, the light emitting device 100 has a common n-type structure in which the first conductivity type semiconductor layers 21, 31, and 41 are commonly electrically connected to one another. However, the inventive concepts are not limited thereto. For example, in some exemplary embodiments, the first conductivity type semiconductor layers 21, 31, and 41 of each LED stack may be p-type, and the second conductivity type semiconductor layers 25, 35, and 45 may be n-type, and thus, the light emitting device may have a common p-type structure. In addition, in some exemplary embodiments, a stack sequence of each LED stack is not limited to that shown in the drawings and may be variously modified, and thus, the electrical connection structure may be variously modified.

FIGS. 5A, 6A, 7A, 8A, 9A, 10A, 11A, 12A, 13A, 14A, 15A, 16A, and 17A are plan views illustrating a method of manufacturing a light emitting device according to an exemplary embodiment, and FIGS. 5B, 6B, 7B, 8B, 9B, 10B, 11B, 12B, 13B, 14B, 15B, 16B, and 17B are schematic cross-sectional views taken along lines A-A' of FIGS. 5A, 6A, 7A, 8A, 9A, 10A, 11A, 12A, 13A, 14A, 15A, 16A, and 17A, respectively.

Figure 5A:
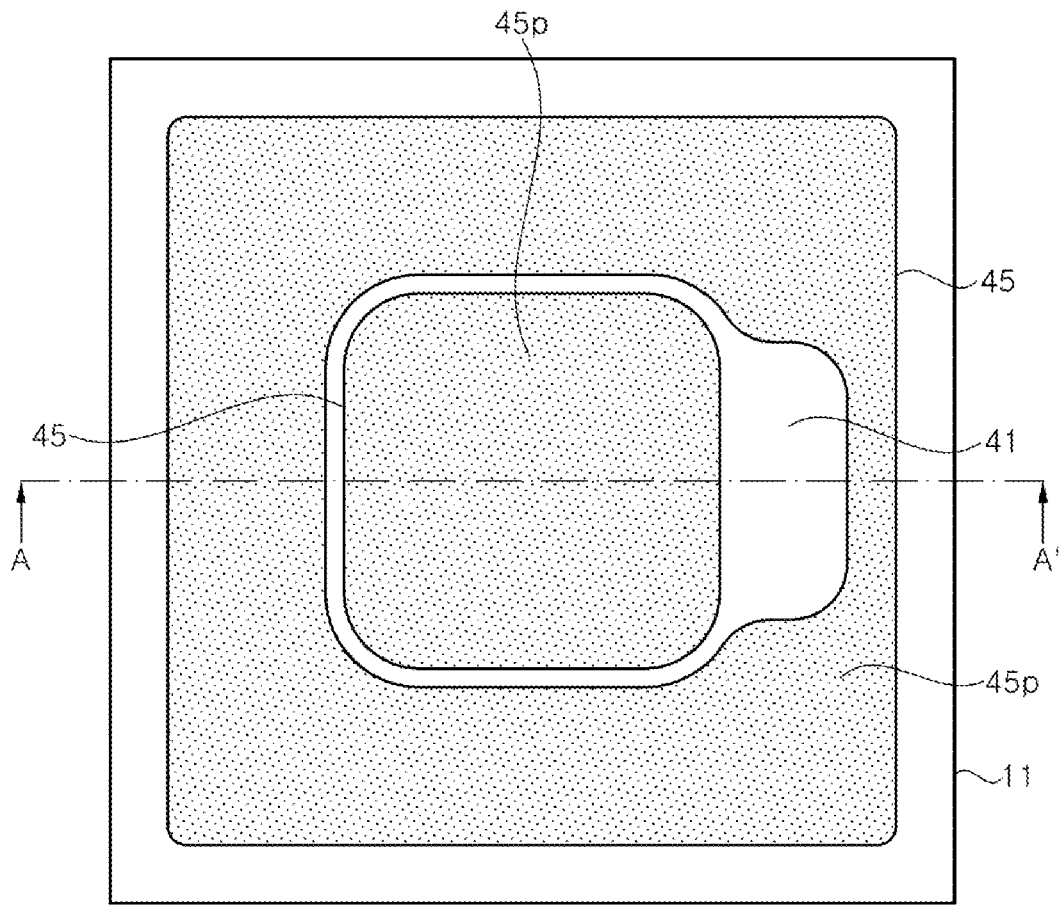
FIGS. 5A, 6A, 7A, 8A, 9A, 10A, 11A, 12A, 13A, 14A, 15A, 16A, and 17A are plan views illustrating a method of manufacturing a light emitting device according to an exemplary embodiment.
Figure 5B:
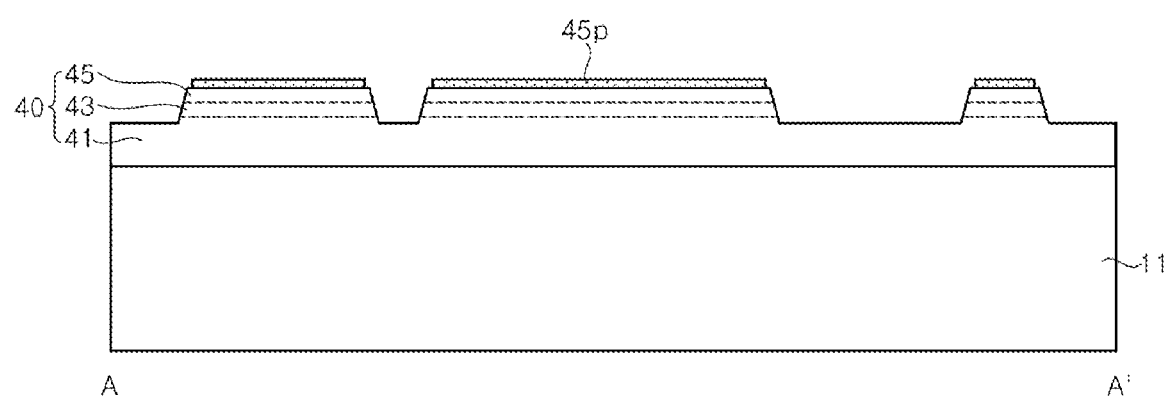
FIGS. 5B, 6B, 7B, 8B, 9B, 10B, 11B, 12B, 13B, 14B, 15B, 16B, and 17B are schematic cross-sectional views taken along lines A-A' of FIGS. 5A, 6A, 7A, 8A, 9A, 10A, 11A, 12A, 13A, 14A, 15A, 16A, and 17A, respectively, where.

First, referring to FIGS. 5A and 5B, a third LED stack 40 is grown on a substrate 11. The third LED stack 40 may include a first conductivity type semiconductor layer 41, an active layer 43, and a second conductivity type semiconductor layer 45. Subsequently, a third transparent electrode 45p may be formed on the second conductivity type semiconductor layer 45.

The first conductivity type semiconductor layer 41, the active layer 43, and the second conductivity type semiconductor layer 45 of the third LED stack 40 may be sequentially grown on the substrate 11 by, for example, a metal organic chemical vapor deposition (MOCVD) method or a molecular beam epitaxy (MBE) method. The third transparent electrode 45p may be formed on the second conductivity type semiconductor layer 45 by, for example, a physical vapor deposition method or a chemical vapor deposition method, and may include a transparent conductive oxide (TCO) such as SnO, InO2, ZnO, ITO, ITZO, or the like. When the third LED stack 40 emits green light, the substrate 11 may be, for example, a patterned sapphire substrate.

Meanwhile, the third transparent electrode 45p, the second conductivity type semiconductor layer 45, and the active layer 43 may be patterned, and accordingly, the first conductivity type semiconductor layer 41 may be exposed. For example, a mesa including the second conductivity type semiconductor layer 45 and the active layer 43 may be formed on the first conductivity type semiconductor layer 41 by mesa etching, and a light generation region may be defined by the mesa. As shown in FIG. 5A, the light generation region may be surrounded by a peripheral region. The first conductivity type semiconductor layer 41 may also be exposed around the peripheral region. The third transparent electrode 45p may be disposed on the second conductivity type semiconductor layer 45 on the light generation region, and may also be disposed on the peripheral region.

A side surface of the peripheral region surrounding the light generation region may be inclined with respect to a vertical surface as shown in FIG. 5B. An outer side surface of the peripheral region may also be inclined with respect to the vertical surface.

Figure 6A:
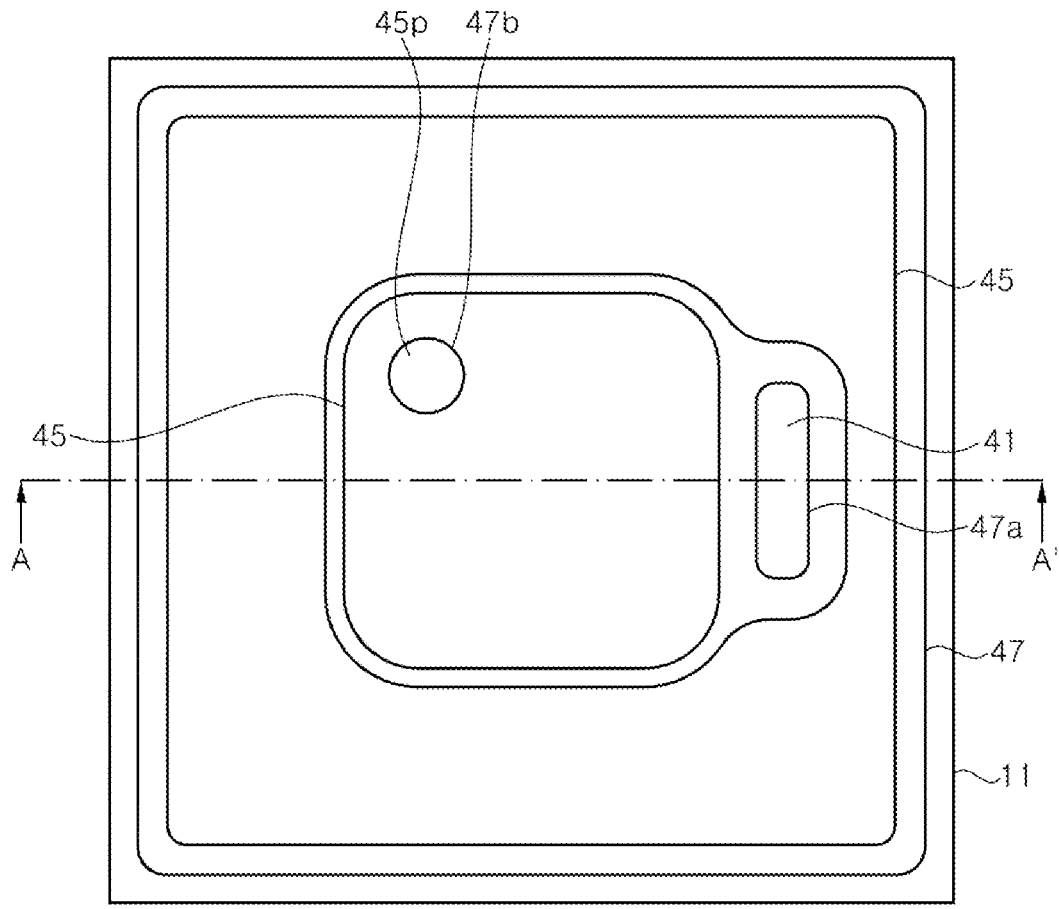
Figure 6B:
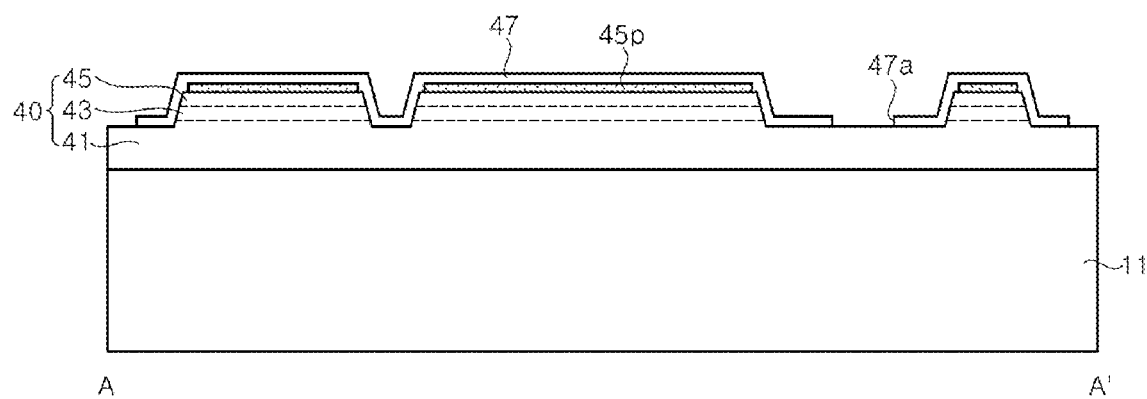

Referring to FIGS. 6A and 6B, a first insulation layer 47 covering the third LED stack 40 and the third transparent electrode 45p is formed. The first insulation layer 47 may cover the light generation region and the peripheral region, and may also cover a mesa etching region between the light generation region and the peripheral region.

However, the first insulation layer 47 may have an opening 47a exposing the first conductivity type semiconductor layer 41 and an opening 47b exposing the third transparent electrode 45p. Furthermore, the first insulation layer 47 may expose an edge of the light emitting device region. The opening 47a may be formed in the mesa etching region, and the opening 47b may be formed in the light generation region.

Figure 7A:
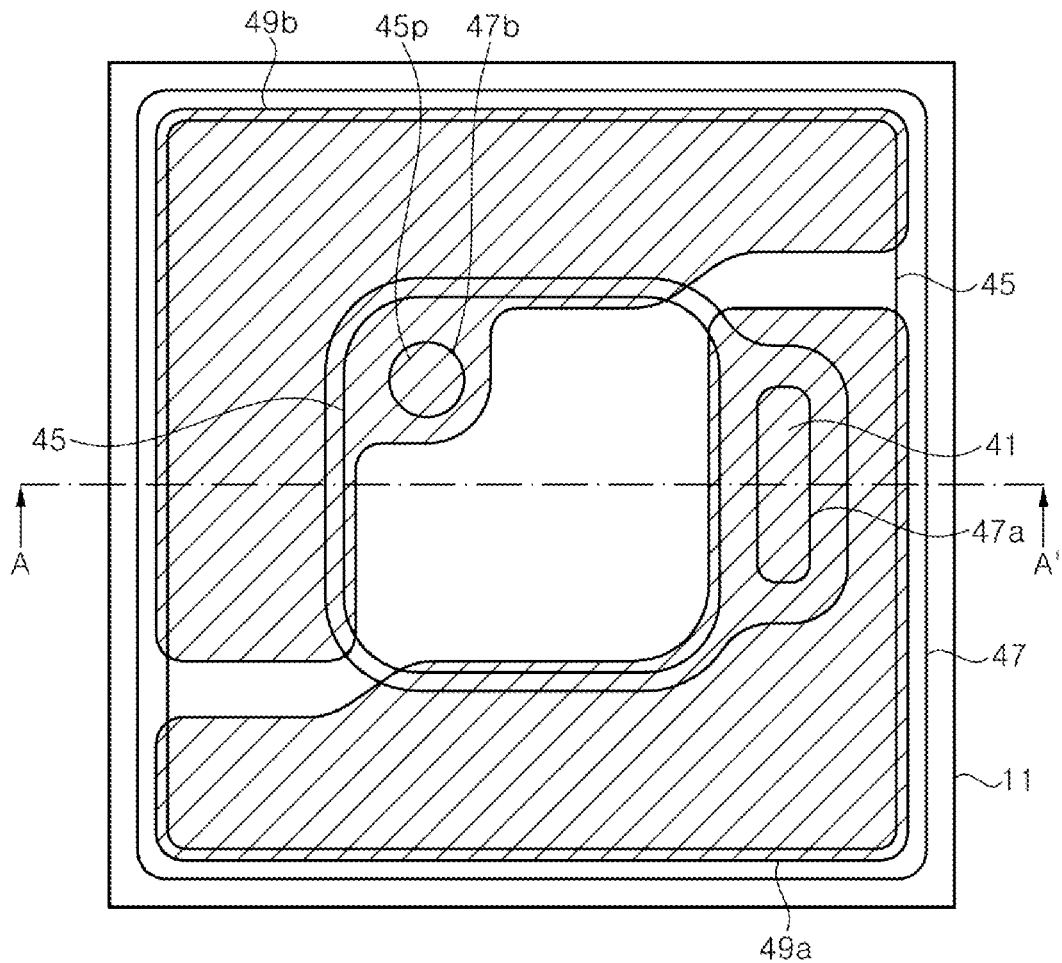
Figure 7B:
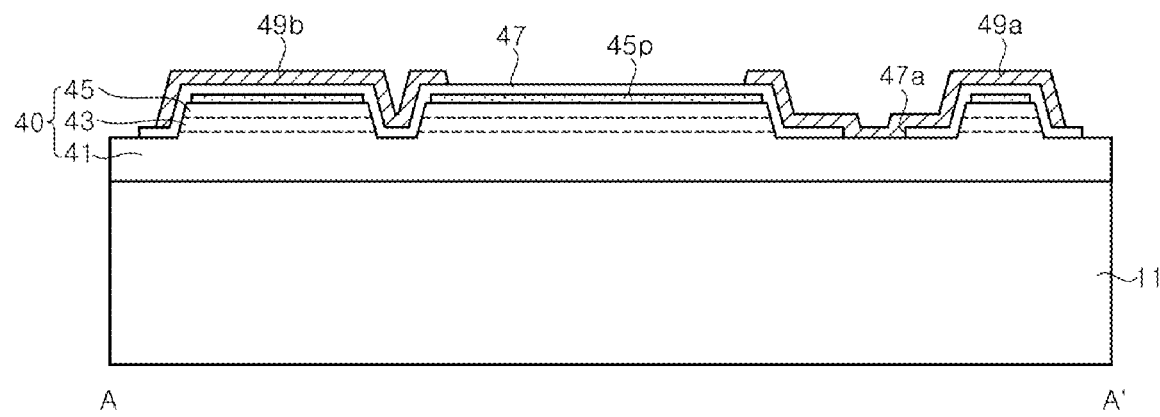

Referring to FIGS. 7A and 7B, a third-1 connector 49a and a third-2 connector 49b may be formed on the first insulation layer 47. The third-1 connector 49a is electrically connected to the first conductivity type semiconductor layer 41 through the opening 47a. The third-2 connector 49b may be electrically connected to the third transparent electrode 45p through the opening 47b. The third-2 connector 49b may extend to the peripheral region across the mesa etching region. The third-1 connector 49a and the third-2 connector 49b may cover most of the side surface of the light generation region, and further, may be formed to cover the outer side surface of the peripheral region. In some forms, the third-1 connector 49a and the third-2 connector 49b may be formed together through the same process using the same material, and may be spaced apart from each other on a same plane. In other forms, a different process and/or different materials may be used in forming the third-1 connector 49a and the third-2 connector 49b.

Figure 8A:
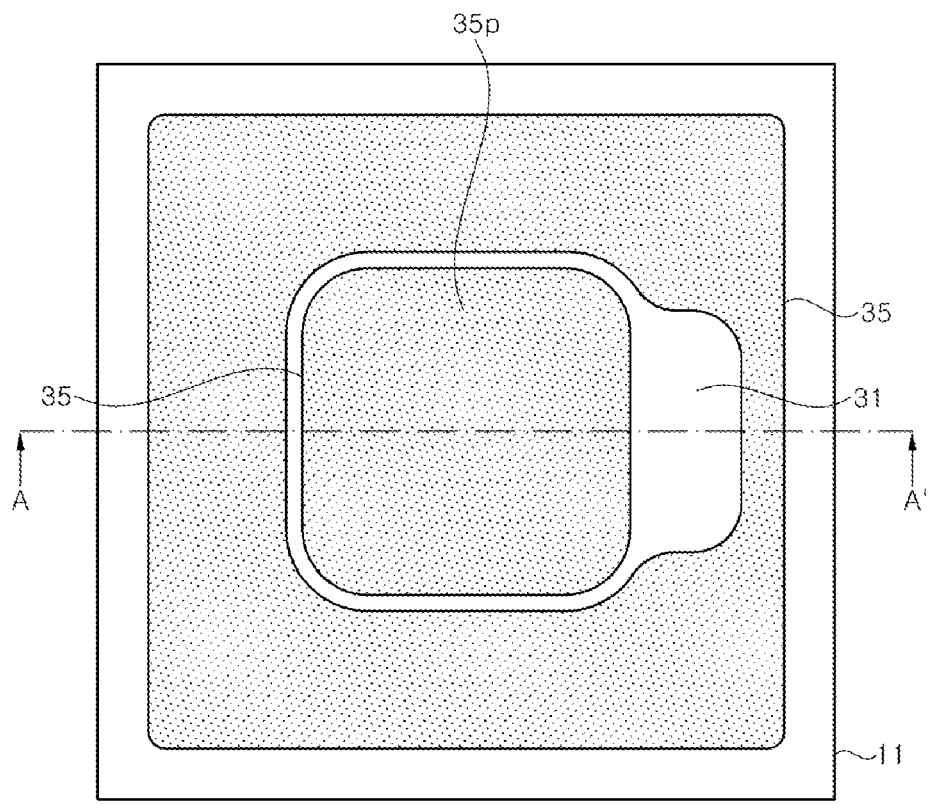
Figure 8B:
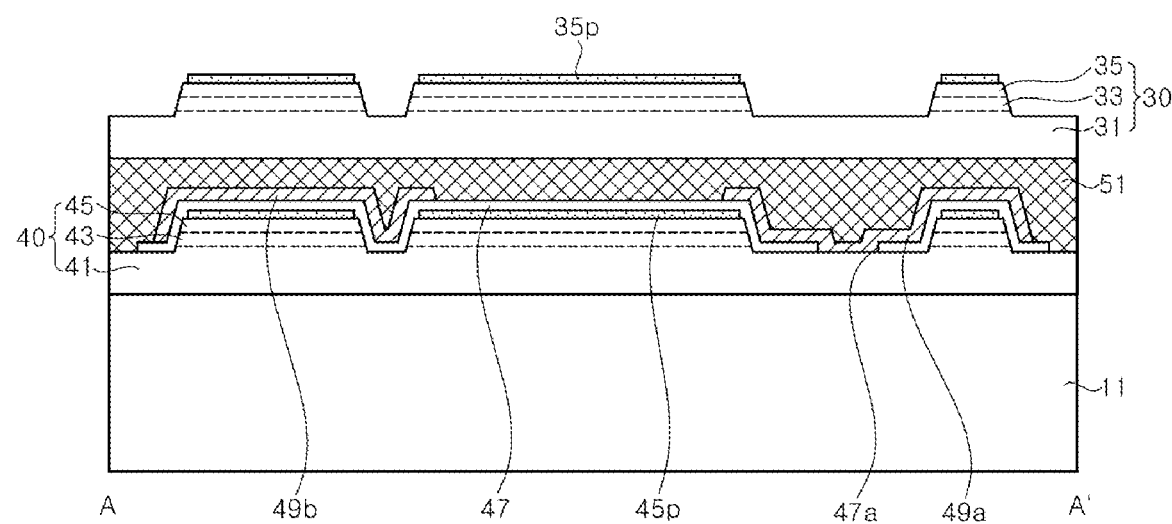

Referring to FIGS. 8A and 8B, a second LED stack 30 is attached on the third LED stack 40 using a first adhesive layer 51. The second LED stack 30 may be grown on a growth substrate in a similar manner for the third LED stack 40, and may include a first conductivity type semiconductor layer 31, an active layer 33, and a second conductivity type semiconductor layer 35. In addition, a second transparent electrode 35p may be formed on the second conductivity type semiconductor layer 35.

Thereafter, the second LED stack 30 may be attached to a temporary substrate to be separated from the growth substrate, and may be attached onto the third LED stack 40 using the first adhesive layer 51 using the temporary substrate. Thereafter, the temporary substrate may be removed, and accordingly, the second LED stack 30 may be attached to the third LED stack 40 so that the second transparent electrode 35p faces upward. This process is well known as TBDB (Temporary Bonding and Debonding).

Meanwhile, the second transparent electrode 35p, the second conductivity type semiconductor layer 35, and the active layer 33 may be patterned, and accordingly, the first conductivity type semiconductor layer 31 may be exposed. For example, a mesa including the second conductivity type semiconductor layer 35 and the active layer 33 may be formed on the first conductivity type semiconductor layer 31, and a light generation region may be defined by the mesa. As shown in FIG. 8A, the light generation region may be surrounded by a peripheral region. The second transparent electrode 35p may be disposed on the second conductivity type semiconductor layer 35 on the light generation region, and may also be disposed on the peripheral region.

Meanwhile, the second conductivity type semiconductor layer 35 and the active layer 33 may be partially removed along an outer periphery of the peripheral region to expose the first conductivity type semiconductor layer 31.

Figure 9A:
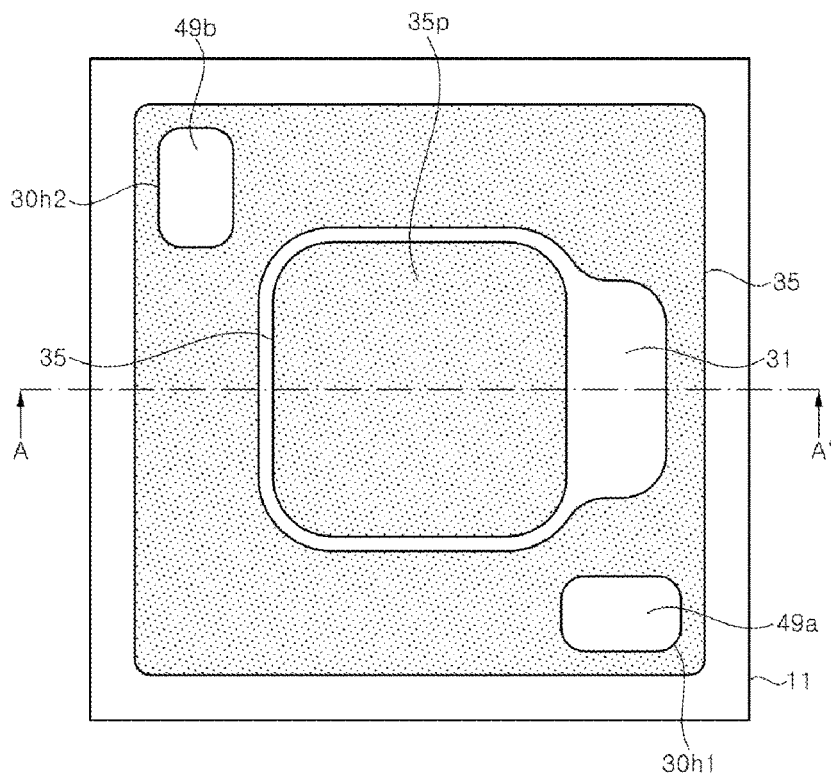
Figure 9B:
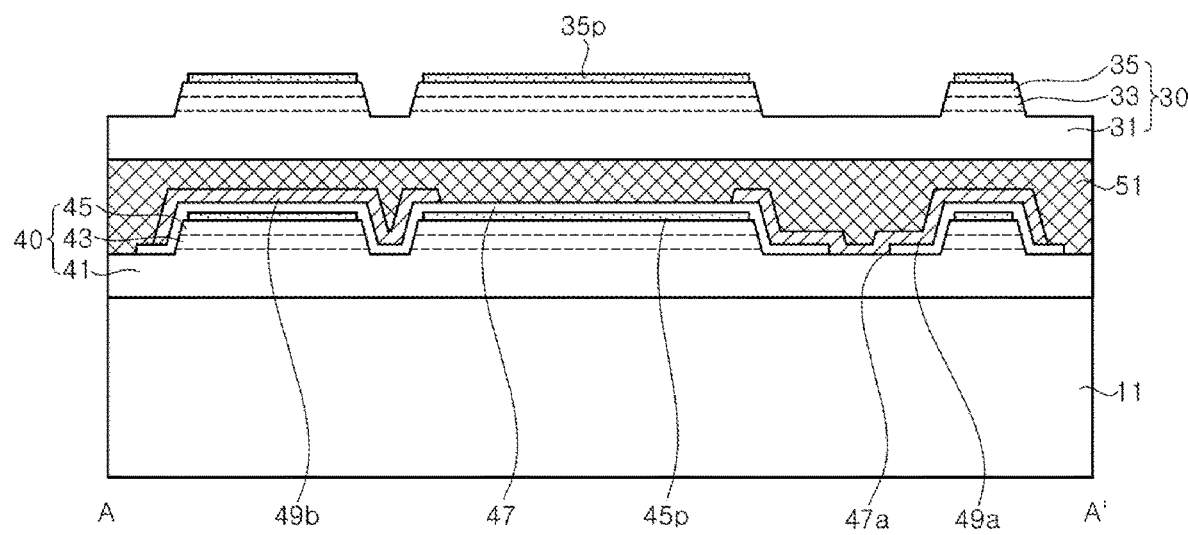

Referring to FIGS. 9A and 9B, through holes 30h1 and 30h2 may be formed in the peripheral region of the second LED stack 30. The through holes 30h1 and 30h2 are formed to pass through the second LED stack 30 and also to pass through the first adhesive layer 51, and thus, expose the third-1 connector 49a and the third-2 connector 49b. The through holes 30h1 and 30h2 may be formed by successively etching the second conductivity type semiconductor layer 35, the active layer 33, and the first conductivity type semiconductor layer 31, but the through holes 30h1 and 30h2 may be formed by further etching the first conductivity type semiconductor layer 31 after first exposing the first conductivity type semiconductor layer 31.

Figure 10A:
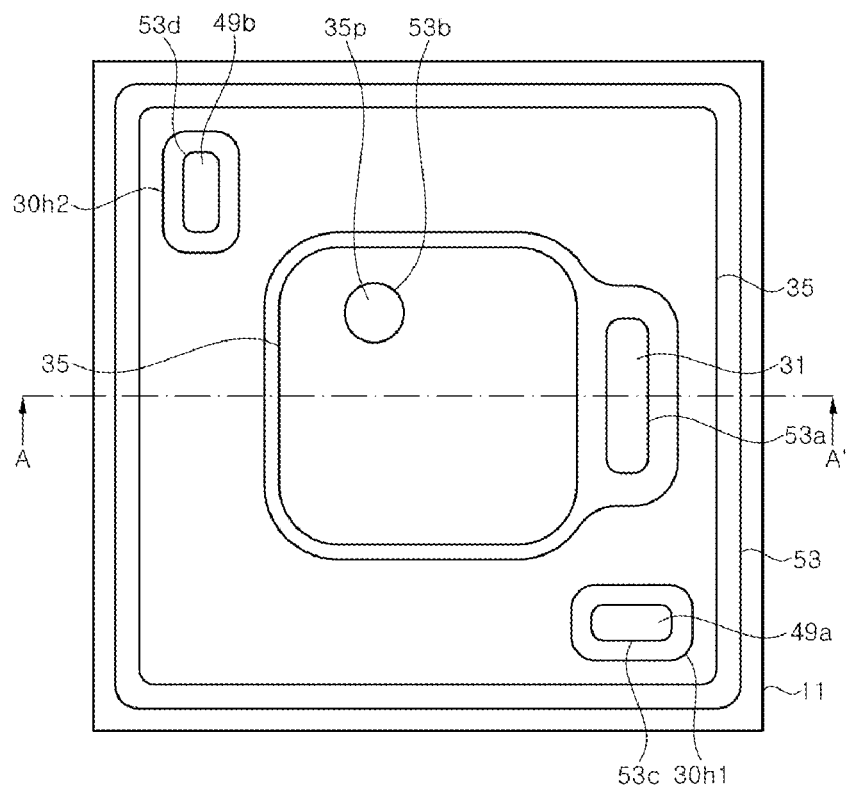
Figure 10B:
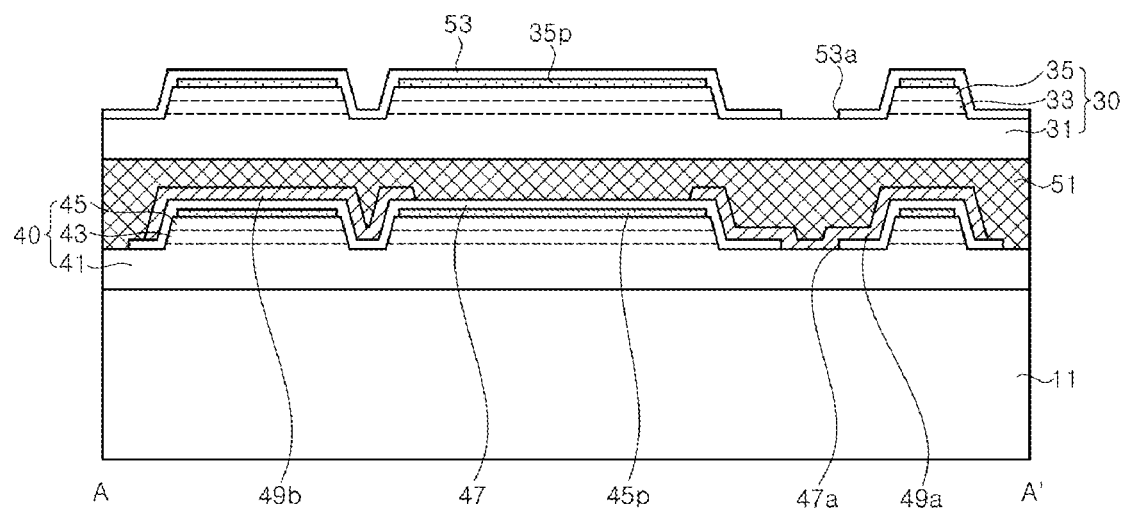

Referring to FIGS. 10A and 10B, a second insulation layer 53 covering the second LED stack 30 and the second transparent electrode 35p is formed. The second insulation layer 53 may cover the light generation region and the peripheral region. In particular, the second insulation layer 53 may cover the side surface of the peripheral region, and may at least partially cover the exposed first conductivity type semiconductor layer 31 around the peripheral region.

However, the second insulation layer 53 may have an opening 53a exposing the first conductivity type semiconductor layer 31 and an opening 53b exposing the second transparent electrode 35p, and may have openings 53c and 53d exposing the third-1 connector 49a and the third-2 connector 49b in the through holes 30h1 and 30h2, respectively. The opening 53a may be formed in the mesa etching region, and the opening 53b may be formed in the light generation region.

Figure 11A:
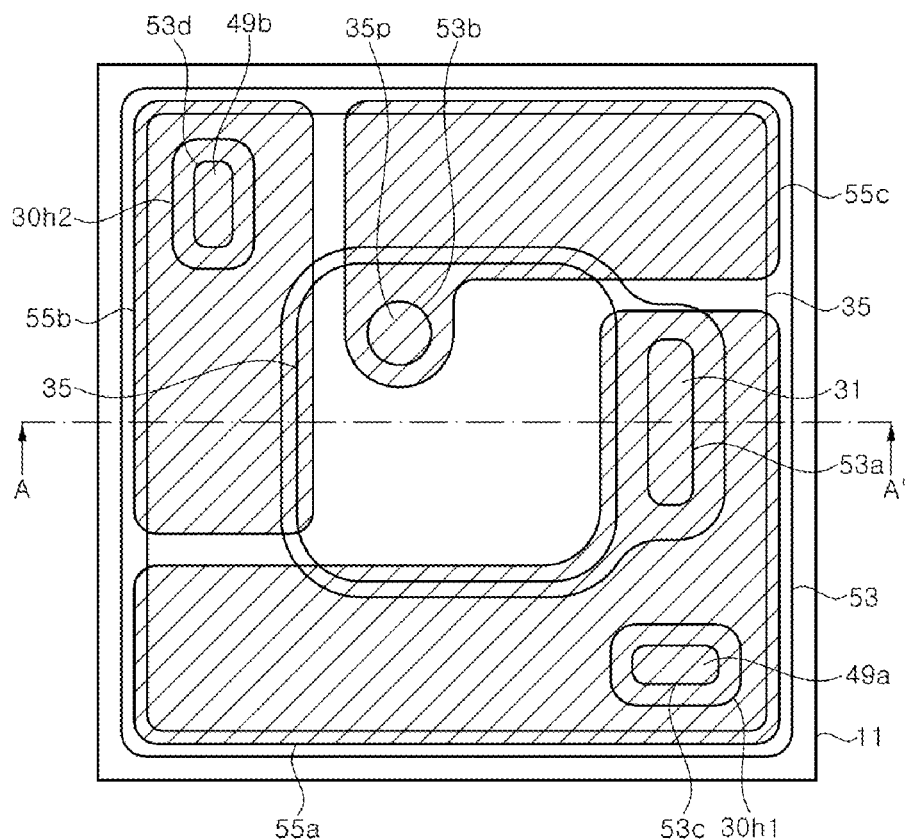
Figure 11B:
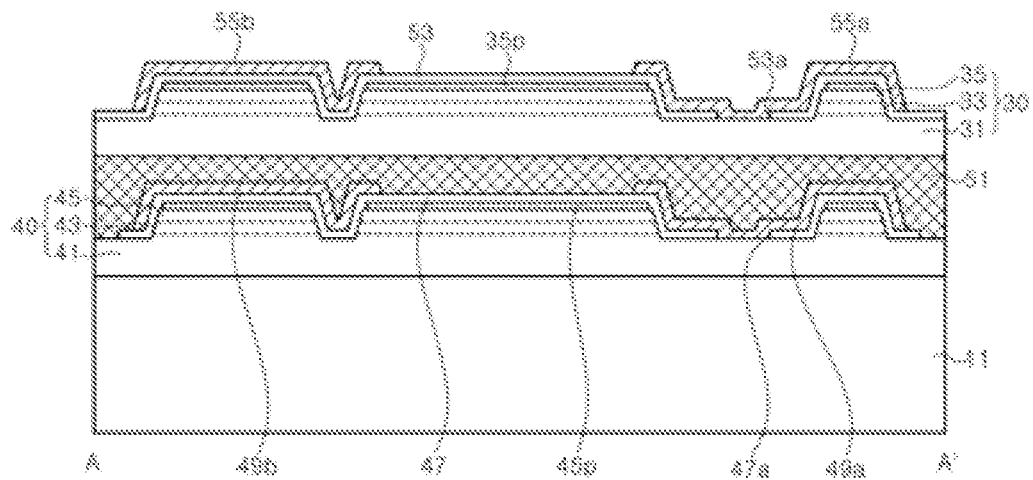

Referring to FIGS. 11A and 11B, a second-1 connector 55a, a second intermediary connector 55b, and a second-2 connector 55c are formed on the second insulation layer 53. In some forms, the second-1 connector 55a, the second intermediary connector 55b, and the second-2 connector 55c may be formed together of the same material through the same process, and may be spaced apart from one another at a same level. In other forms, a different process and/or different materials may be used in forming the second-1 connector 55a, the second intermediary connector 55b, and the second-2 connector 55c.

The second-1 connector 55a is electrically connected to the first conductivity type semiconductor layer 31 through the opening 53a. In addition, the second-1 connector 55a may be electrically connected to the third-1 connector 49a through the through hole 30h1 in the peripheral region, as shown in FIG. 11A.

The second-2 connector 55c may be electrically connected to the second transparent electrode 35p through the opening 53b. The second-2 connector 55c may extend to the peripheral region across the mesa etching region. In an exemplary embodiment, a region where the second-2 connector 55c is connected to the second transparent electrode 35p may be overlapped with a region where the third-2 connector 49b is connected to the third transparent electrode 45p.

The second intermediary connector 55b may be electrically connected to the third-2 connector 49b through the through hole 30h2 in the peripheral region of the second LED stack 30.

As shown in FIG. 11A, the second-1 connector 55a, the second intermediary connector 55b, and the second-2 connector 55c are formed to mostly cover the side surface of the light generation region, and further, formed to mostly cover the outer side surface of the peripheral region. For example, the second-1 connector 55a, the second intermediary connector 55b, and the second-2 connector 55c may cover 80% or more, in one variant, 90% or more, or in another variant, 95% or more of an entire side surface of the light generation region. In addition, the second-1 connector 55a, the second intermediary connector 55b, and the second-2 connector 55c may cover 80% or more, in one variant, 90% or more, or in another variant, 95% or more of an entire side surface of the peripheral region.

Figure 12A:
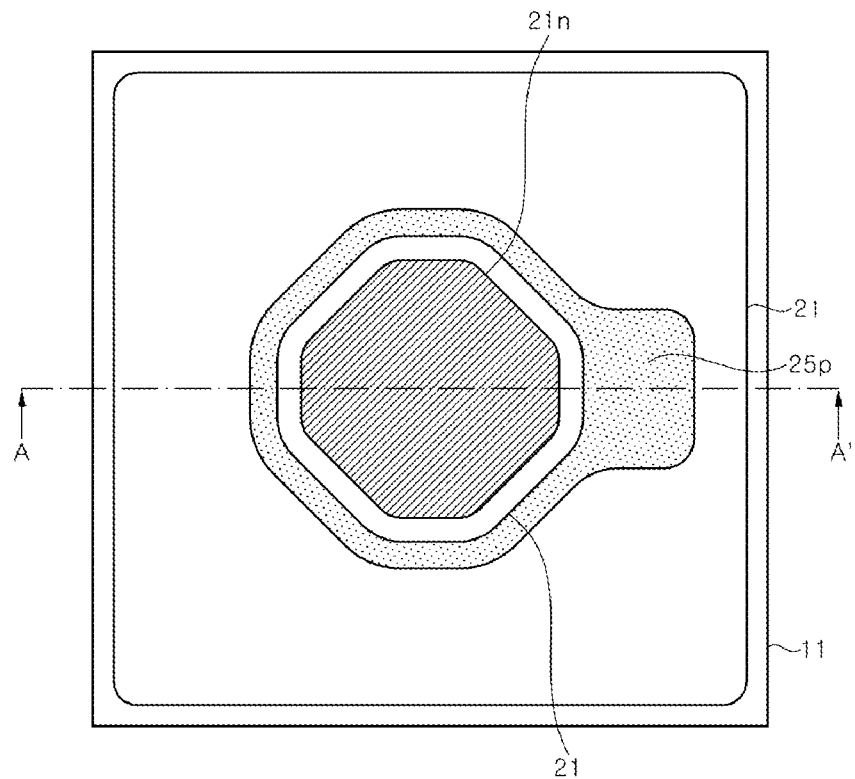
Figure 12B:
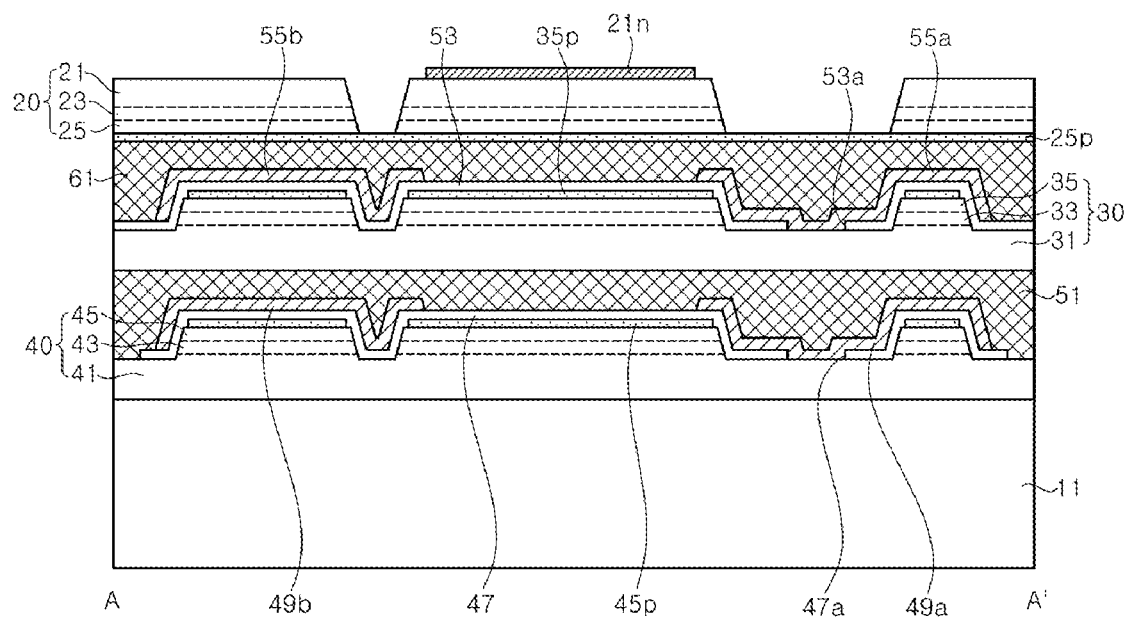

Referring to FIGS. 12A and 12B, the first LED stack 20 may be attached to the second LED stack 30 using a second adhesive layer 61. The first LED stack 20 may be grown on a growth substrate, and a first transparent electrode 25p may be formed on the grown first LED stack 20. Thereafter, the growth substrate may be removed after the first LED stack 20 is attached to the second LED stack 30 by the second adhesive layer 61. Accordingly, the first LED stack 20 may be attached onto the second LED stack 30 so that a first conductivity type semiconductor layer 21 is disposed on an upper side. That is, the first transparent electrode 25p may be attached to the second adhesive layer 61.

Meanwhile, a first ohmic electrode 21n is formed on the first conductivity type semiconductor layer 21. The first ohmic electrode 21n may be formed to be at least partially overlapped with the light generation regions of the second LED stack 30 and the third LED stack 40. The first ohmic electrode 21n may be in ohmic contact with the first conductivity type semiconductor layer 21, and for this purpose, a portion of the first conductivity type semiconductor layer 21 may be removed. For example, a portion of an upper surface of the first conductivity type semiconductor layer 21 of the first LED stack 20 may be patterned through wet etching to form the first ohmic electrode 21n. The first conductivity type semiconductor layer 21 may be, for example, an n$^{++}$ GaAs layer, and a portion of an upper surface of the n$^{++}$ GaAs layer may be recessed through wet etching. The first ohmic electrode 21n may be formed in a recessed region of the first conductivity type semiconductor layer 21. The first ohmic electrode 21n may be formed of, for example, AuGe/Ni/Au/Ti, and may be formed to have a thickness of (100 nm/25 nm/100 nm/10 nm), for example.

In addition, the first conductivity type semiconductor layer 21, an active layer 23, and a second conductivity type semiconductor layer 25 are patterned to expose the first transparent electrode 25p. A light generation region is formed under the first ohmic electrode 21n, and a peripheral region may surround the light generation region. The light generation region and the peripheral region may be separated by a groove exposing the first transparent electrode 25p.

Figure 13A:
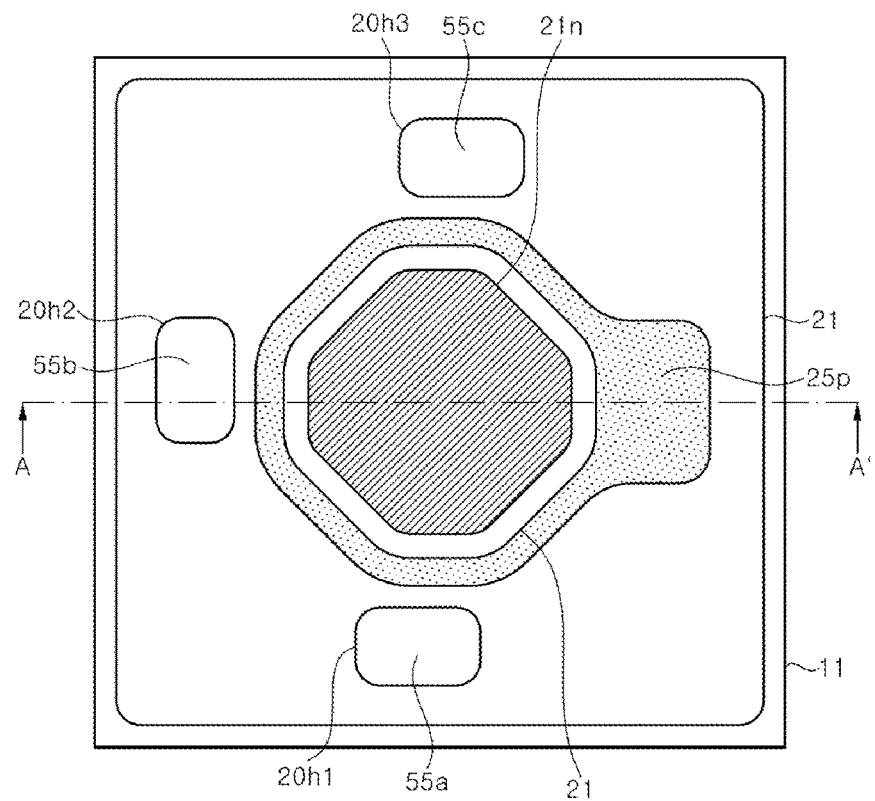
Figure 13B:
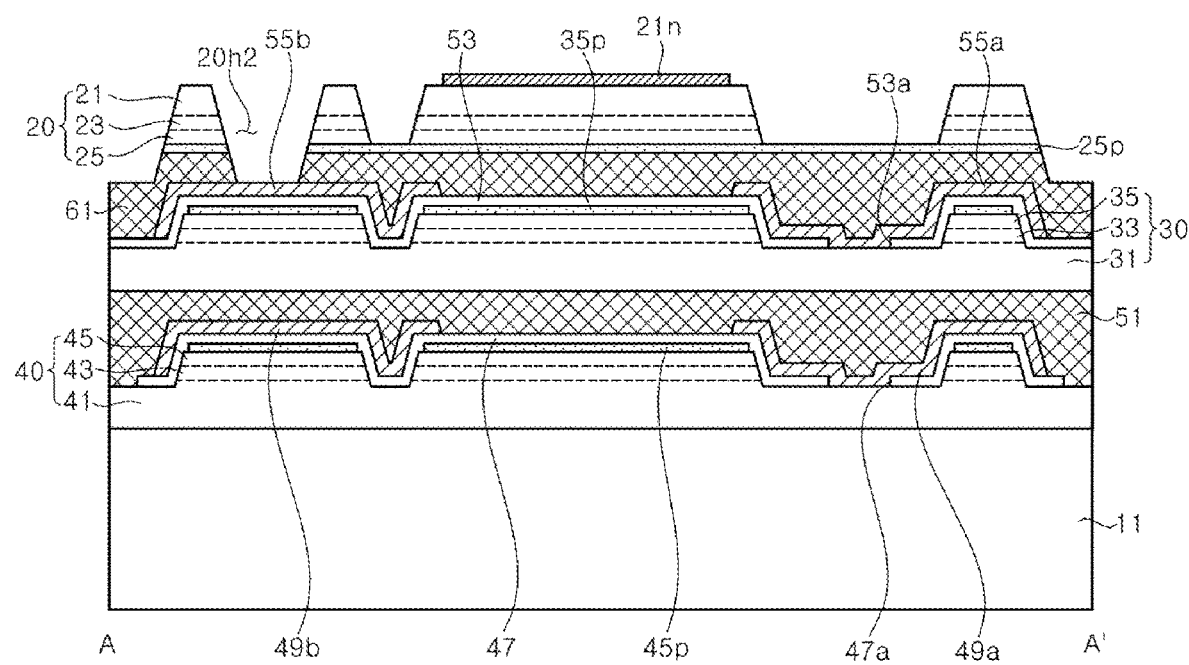

Referring to FIGS. 13A and 13B, through holes 20h1, 20h2, and 20h3 passing through the first LED stack 20, the first transparent electrode 25p, and the second adhesive layer 61 in the peripheral region may be formed. The through holes 20h1, 20h2, and 20h3 may expose the second-1 connector 55a, the second intermediary connector 55b, and the second-2 connector 55c, respectively.

The through holes 20h1, 20h2, and 20h3 may be formed by successively etching the first LED stack 20, the first transparent electrode 25p, and the second adhesive layer 61, but the inventive concepts are not necessarily limited thereto. For example, the first LED stack 20 may be partially removed to expose the first transparent electrode 25p in the peripheral region while the groove is formed to separate the light generation region and the peripheral region. Subsequently, the through holes 20h1, 20h2, and 20h3 may be formed by removing the first transparent electrode 25p and the second adhesive layer 61 exposed in the peripheral region.

While the through holes 20h1, 20h2, and 20h3 are formed, the first LED stack 20 and the first transparent electrode 25p may be removed along the periphery of the peripheral region, and the second adhesive layer 61 may be at least partially removed. Accordingly, the side surface of the peripheral region may be formed to be inclined with respect to the vertical surface.

Figure 14A:
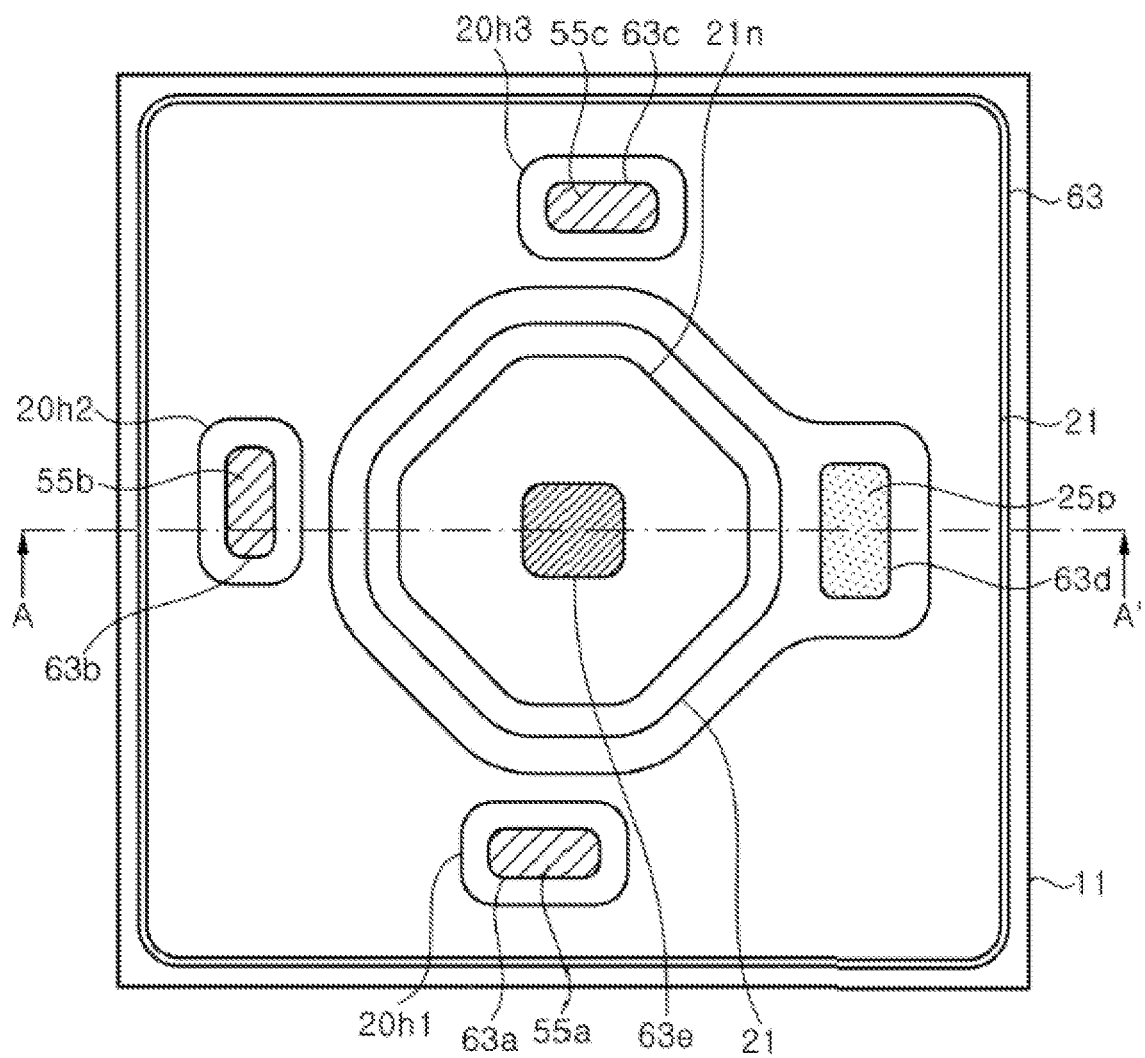
Figure 14B:
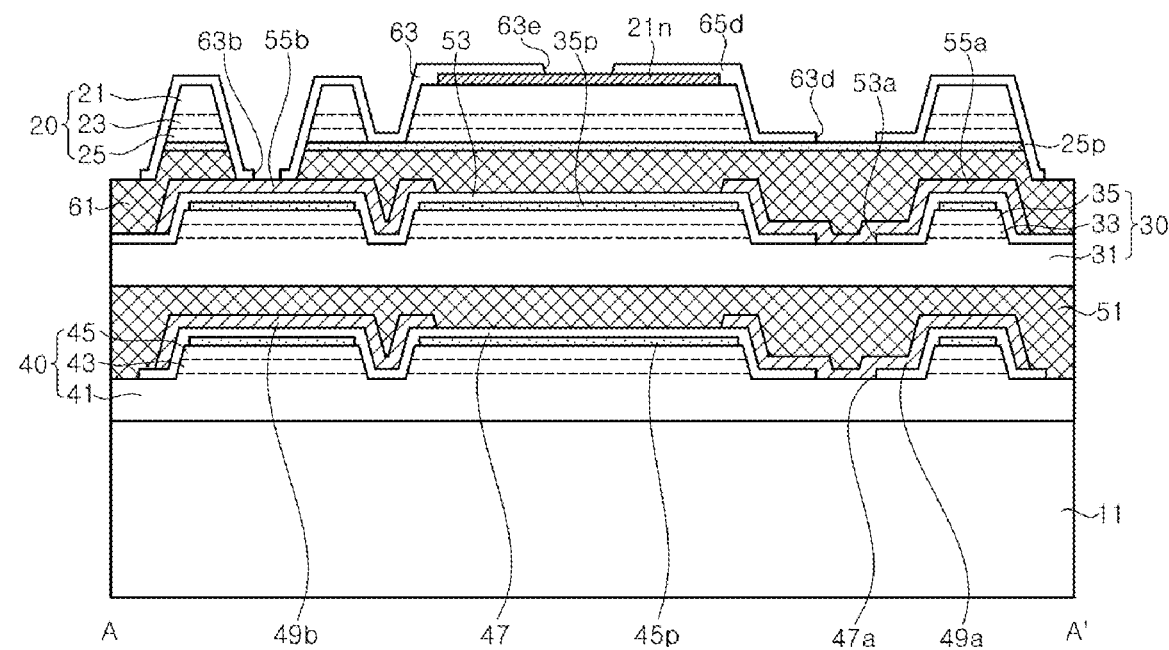

Referring to FIGS. 14A and 14B, a third insulation layer 63 covering the first LED stack 20 and the first ohmic electrode 21n is formed. The third insulation layer 63 may cover the exposed first transparent electrode 25p. Meanwhile, the third insulation layer 63 may have openings 63a, 63b and 63c exposing the second-1 connector 55a, the second intermediary connector 55b, and the second-2 connector 55c in the through holes 20h1, 20h2, and 20h3. Furthermore, the third insulation layer 63 may have an opening 63d exposing the first transparent electrode 25p and an opening 63e exposing the first ohmic electrode 21n near the light generation region. Furthermore, the third insulation layer 63 may cover the side surface of the peripheral region and a side surface of the first transparent electrode 25p. In addition, the third insulation layer 63 may cover at least a portion of a side surface of the second adhesive layer 61.

Figure 15A:
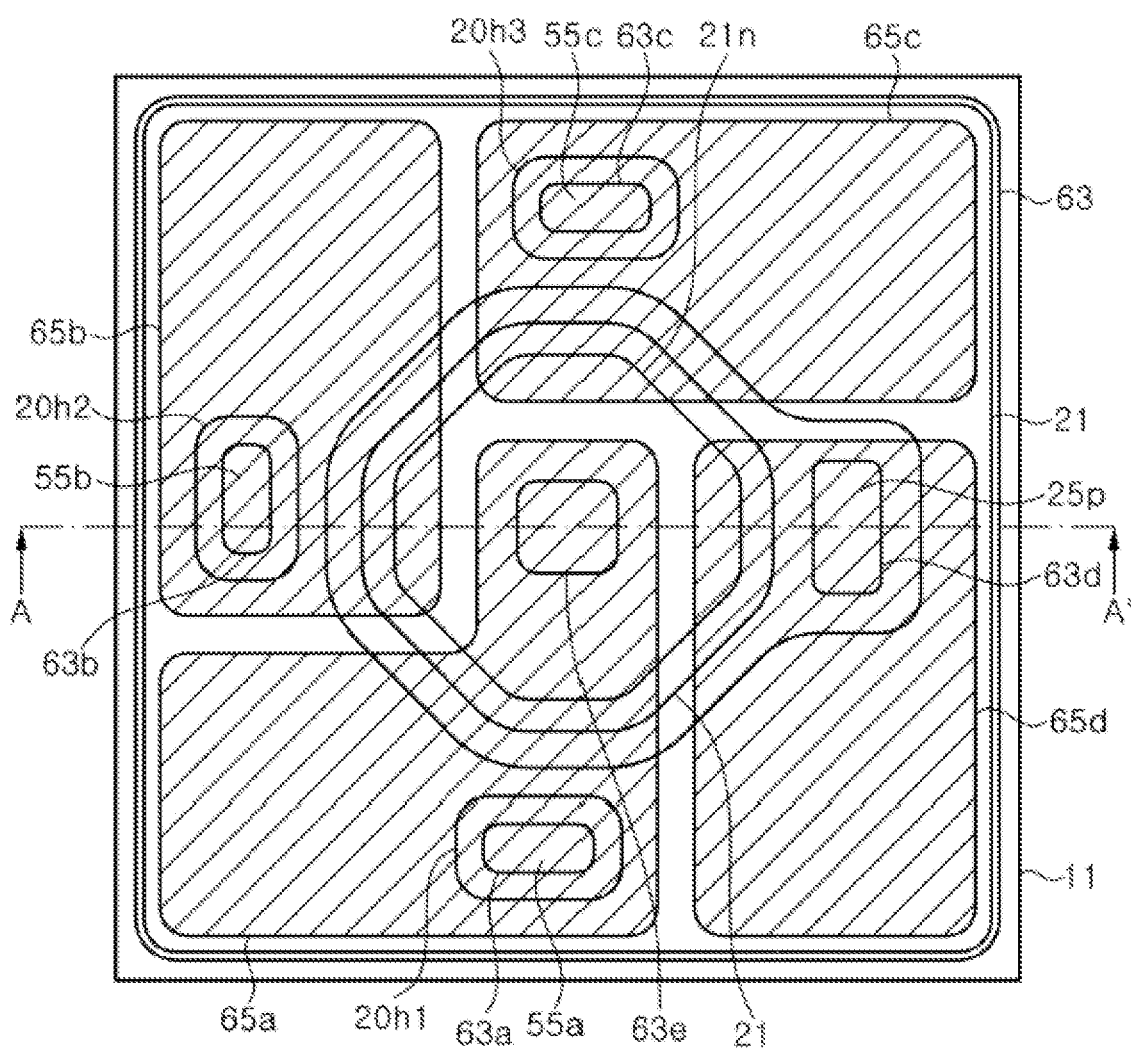
Figure 15B:
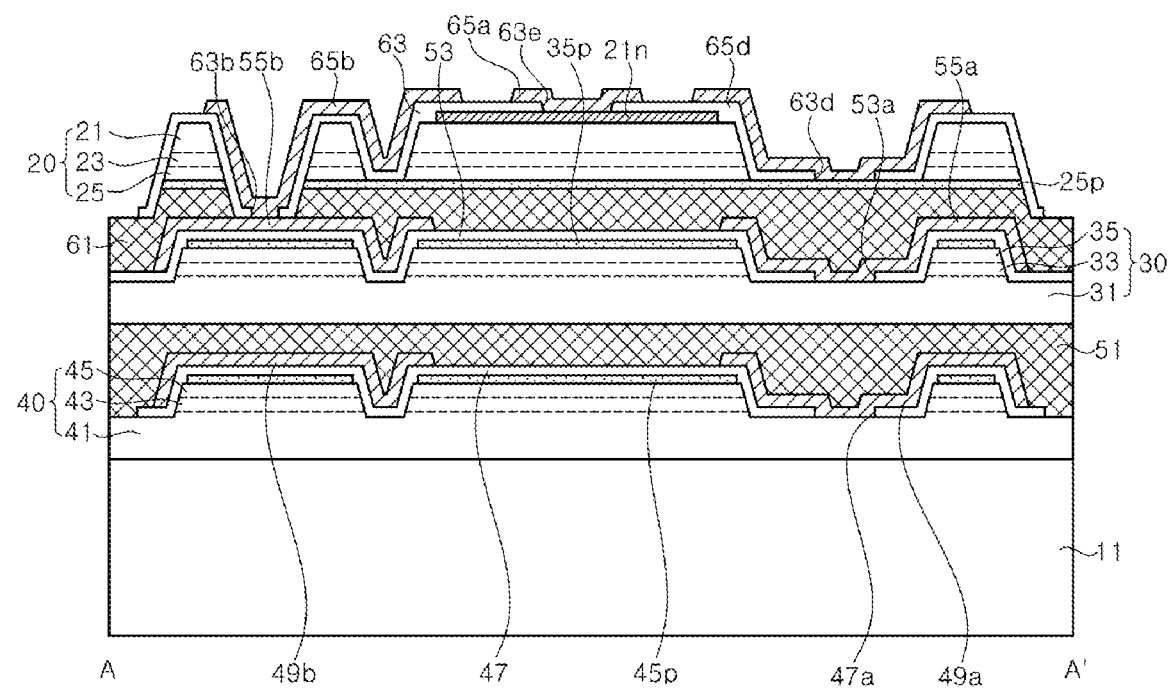

Referring to FIGS. 15A and 15B, a first-1 connector 65a, a first-1 intermediary connector 65b, a first-2 intermediary connector 65c, and a first-2 connector 65d are formed on the third insulation layer 63. In some forms, the first-1 connector 65a, the first-1 intermediary connector 65b, the first-2 intermediary connector 65c, and the first-2 connector 65d may be formed together of the same material through the same process, and may be spaced apart from one another in a lateral direction at a same level. In other forms, a different process and/or different materials may be used for forming the first-1 connector 65a, the first-1 intermediary connector 65b, the first-2 intermediary connector 65c, and the first-2 connector 65d.

The first-1 connector 65a is electrically connected to the first ohmic electrode 21n exposed through the opening 63e. The first-1 connector 65a may also extend from the light generation region to the peripheral region and may be electrically connected to the second-1 connector 55a exposed through the through hole 20h1 and the opening 63a. The first-1 connector 65a may be electrically connected to first conductivity type semiconductor layers 31 and 41 of the second and third LED stacks 30 and 40 through the second-1 connector 55a and the third-1 connector 49a.

Meanwhile, the first-2 connector 65d may be electrically connected to the first transparent electrode 25p exposed through the opening 63d. The opening 63d may be formed in a groove between the light generation region and the peripheral region. The first-2 connector 65d may extend from the opening 63d to the peripheral region, as shown in FIGS. 15A and 15B.

The first-1 intermediary connector 65b may be electrically connected to the second intermediary connector 55b exposed through the through hole 20h2 and the opening 63b. As such, the first-1 intermediary connector 65b may be electrically connected to the second conductivity type semiconductor layer 45 of the third LED stack 40 through the second intermediary connector 55b and the third-2 connector 49b.

The first-2 intermediary connector 65c may be electrically connected to the second-2 connector 55c exposed through the through hole 20h3 and the opening 63c. The first-2 intermediary connector 65c may be electrically connected to the second conductivity type semiconductor layer 35 of the second LED stack 30 through the second-2 connector 55c.

The first-1 connector 65a, the first-1 intermediary connector 65b, the first-2 intermediary connector 65c, and the first-2 connector 65d may be formed to mostly cover the side surface of the light generation region. For example, the first-1 connector 65a, the first-1 intermediary connector 65b, the first-2 intermediary connector 65c, and the first-2 connector 65d may cover 80% or more, in one variant, 90% or more, or in another variant, 95% or more of the side surface of the light generation region. Meanwhile, the first-1 connector 65a, the first-1 intermediary connector 65b, the first-2 intermediary connector 65c, and the first-2 connector 65d may cover the outer side surface of the peripheral region, although not entirely cover the outer side surface of the peripheral region.

Figure 16A:
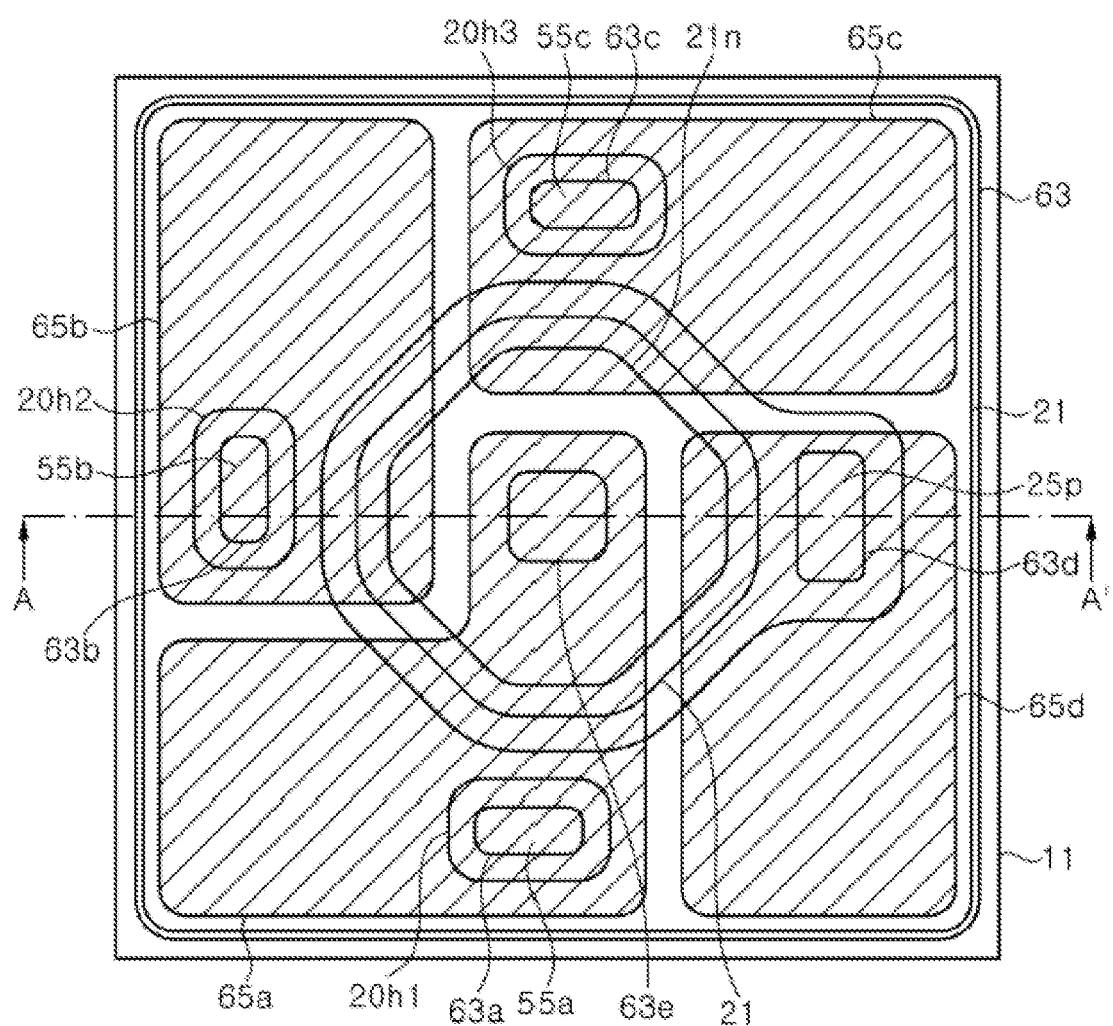
Figure 16B:
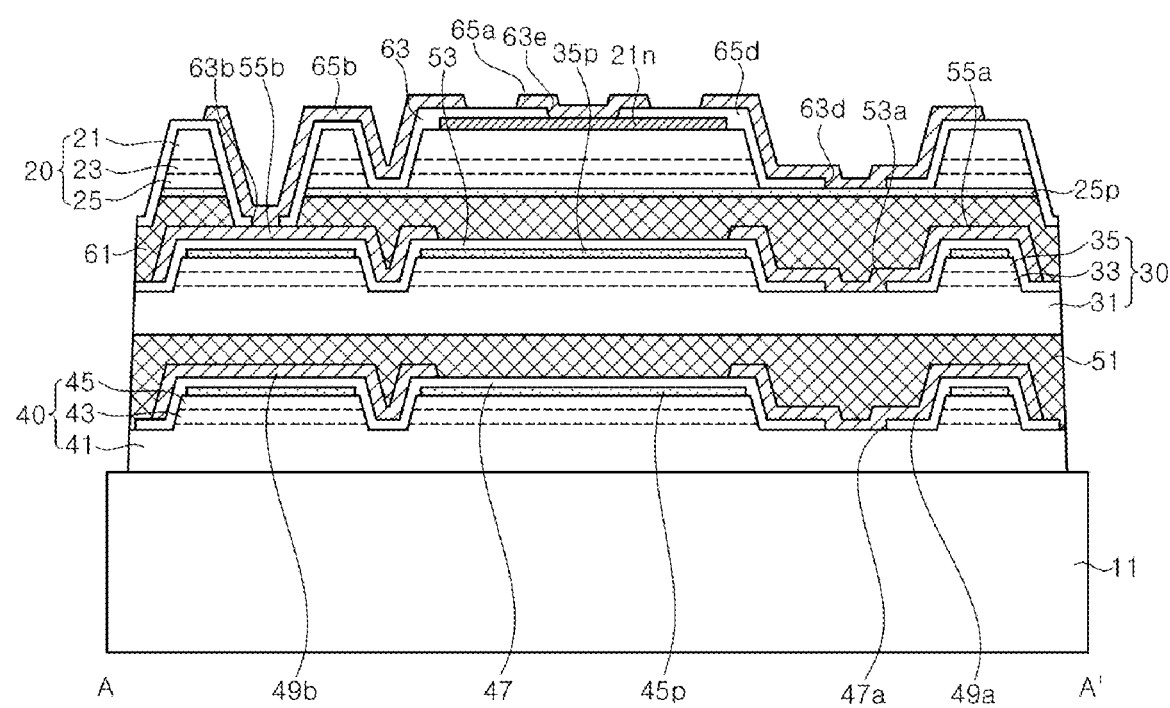

Referring to FIGS. 16A and 16B, a separation process for separating the LEDs on the substrate 11 from adjacent LEDs is carried out. The second adhesive layer 61, the second LED stack 30, the first adhesive layer 51, and the third LED stack 40 may be sequentially removed to expose the substrate 11 between the light emitting devices. The separation process may be carried out using an etching technique or may be carried out using a laser beam.

Side surfaces of the first adhesive layer 51, the second adhesive layer 61, and the first conductivity type semiconductor layers 31 and 41 may be exposed by the separation process. In addition, side surfaces of the first insulation layer 47 and the second insulation layer 53 may be exposed.

Figure 17A:
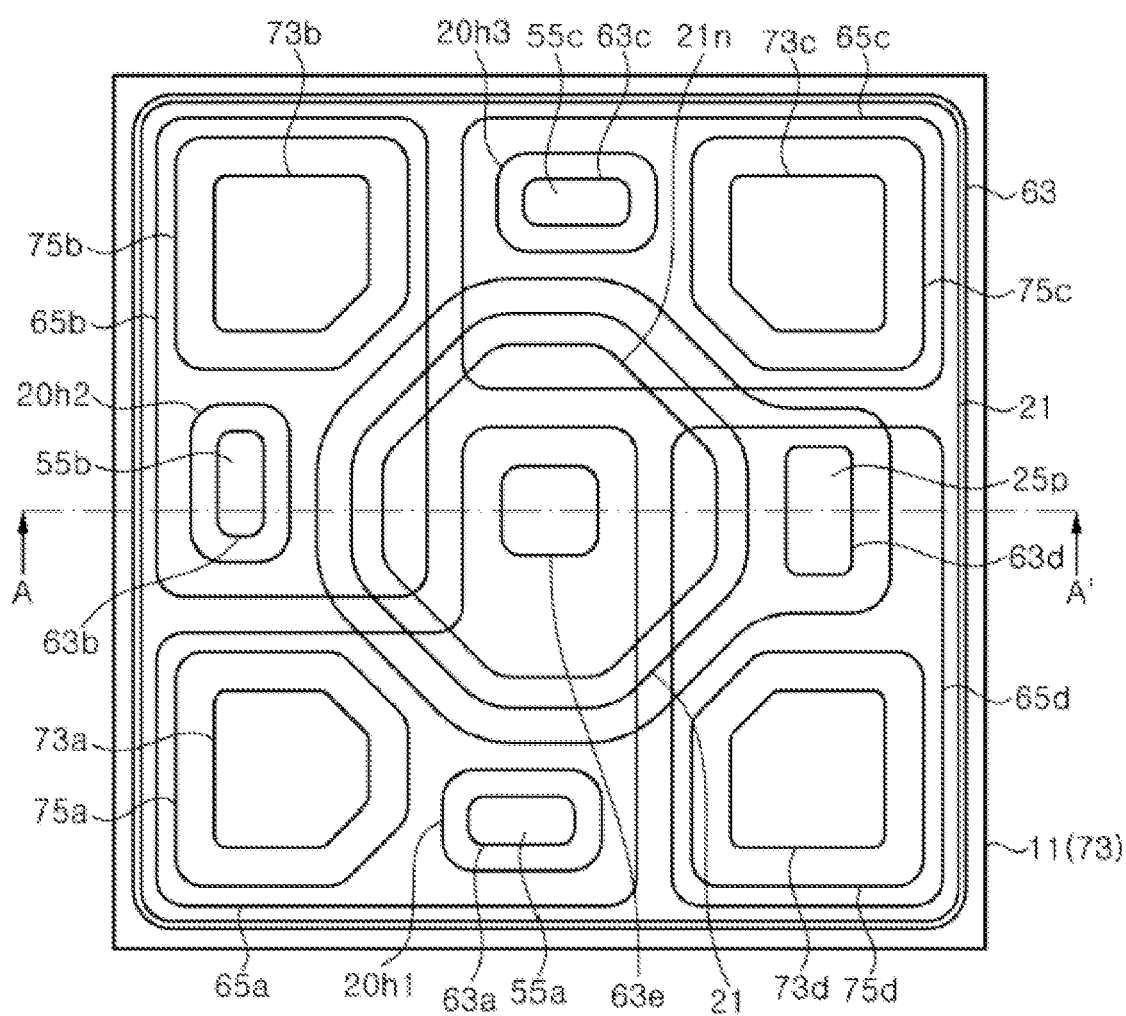
Figure 17B:
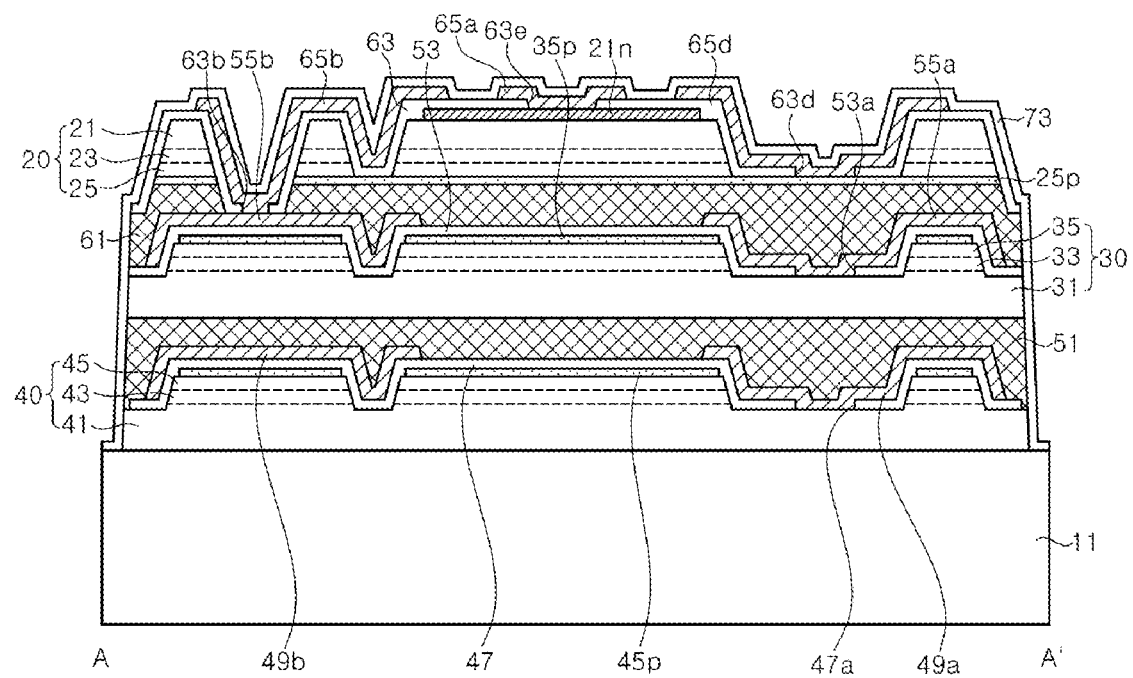

Referring to FIGS. 17A and 17B, a protection insulation layer 73 covering the first-1 connector 65a, the first-1 intermediary connector 65b, the first-2 intermediary connector 65c, and the first-2 connector 65d is formed. The protection insulation layer 73 may cover an edge of the third insulation layer 63. The protection insulation layer 73 may also cover the side surfaces of the first adhesive layer 51, the second adhesive layer 61, and the first conductivity type semiconductor layers 31 and 41 exposed by the separation process.

As the protection insulation layer 73 is formed, it is possible to prevent moisture or the like from penetrating into the light emitting device 100. The protection insulation layer 73 may include, for example, $SiO_2$, $Si_3N_4$, or $Al_2O_3$.

The protection insulation layer 73 may have openings 73a, 73b, 73c, and 73d exposing the first-1 connector 65a, the first-1 intermediary connector 65b, the first-2 intermediary connector 65c, and the first-2 connector 65d. The openings 73a, 73b, 73c, and 73d may be spaced apart from the light generation region of the first LED stack 20 in the lateral direction to be located over the peripheral region.

Subsequently, bump pads 75a, 75b, 75c, and 75d covering the openings 73a, 73b, 73c, and 73d of the protection insulation layer 73 may be formed. The bump pads 75a, 75b, 75c, and 75d may be formed to have a larger area than the openings 73a, 73b, 73c, and 73d to cover the openings. However, the inventive concepts are not limited thereto, and the bump pads 75a, 75b, 75c, and 75d may be formed in the openings. For example, the bump pads 75a, 75b, 75c, and 75d may be formed through a lift-off technique using a photoresist pattern for forming the openings 73a, 73b, 73c, and 73d of the protection insulation layer 73.

The bump pads 75a, 75b, 75c, and 75d may be formed using, for example, an electroplating technique. The bump pads 75a, 75b, 75c, and 75d may be formed near the edge of the light emitting device 100. Thereafter, the light emitting device 100 may be completed by cutting the substrate 11 using a laser.

In the illustrated exemplary embodiment, although it is described that the protection insulation layer 73 is formed after the separation process is carried out, the separation process may be carried out together with the substrate separation process after the protection insulation layer 73 is formed. In this case, the side surfaces of the first and second adhesive layers 51 and 61 and the side surfaces of the first conductivity type semiconductor layers 31 and 41 may be exposed to the outside of the light emitting device 100.

In the illustrated exemplary embodiment, each of the first, second, and third LED stacks 20, 30, and 40 has the light generation region and the peripheral region. In the first LED stack 20, all of the first conductivity type semiconductor layer 21, the active layer 23, and the second conductivity type semiconductor layer 25 are separated into the peripheral region and the light generation region. In contrast, in the second LED stack 30 and the third LED stack 40, the active layers 33 and 43 and the second conductivity type semiconductor layers 35 and 45 are separated from one another, but the first conductivity type semiconductor layers 31 and 41 under the peripheral region and the light generation region are connected to each other. However, the inventive concepts are not limited thereto, and the first conductivity type semiconductor layers 31 and 41 under the peripheral region and the light generation region may also be separated from each other.

According to the illustrated exemplary embodiment, the bump pads 75a, 75b, 75c, and 75d are formed on the peripheral region of the first LED stack 20. Since the bump pads 75a, 75b, 75c, and 75d do not need to extend to the second LED stack 30, the third LED stack 40, or the substrate 11, they may be formed to have a relatively thin thickness. As such, the bump pads 75a, 75b, 75c, and 75d may be easily formed, and stability of the bump pads 75a, 75b, 75c, and 75d may be improved.

Further, according to the illustrated exemplary embodiment, as most of the side surfaces of the light generation regions of the first, second, and third LED stacks 20, 30, 40 are covered with a metallic layer, it is possible to block light progression in the lateral direction in each LED stack, and thus, a viewing angle of emitted light may be reduced. In addition, it is possible to block light emission to a side surface of the light emitting device 100 by covering the outer side surface of the peripheral region of the second LED stack 30 and the third LED stack 40 with the metallic layer, and thus, light interference between the light emitting devices 100 may be prevented.

Figure 18:
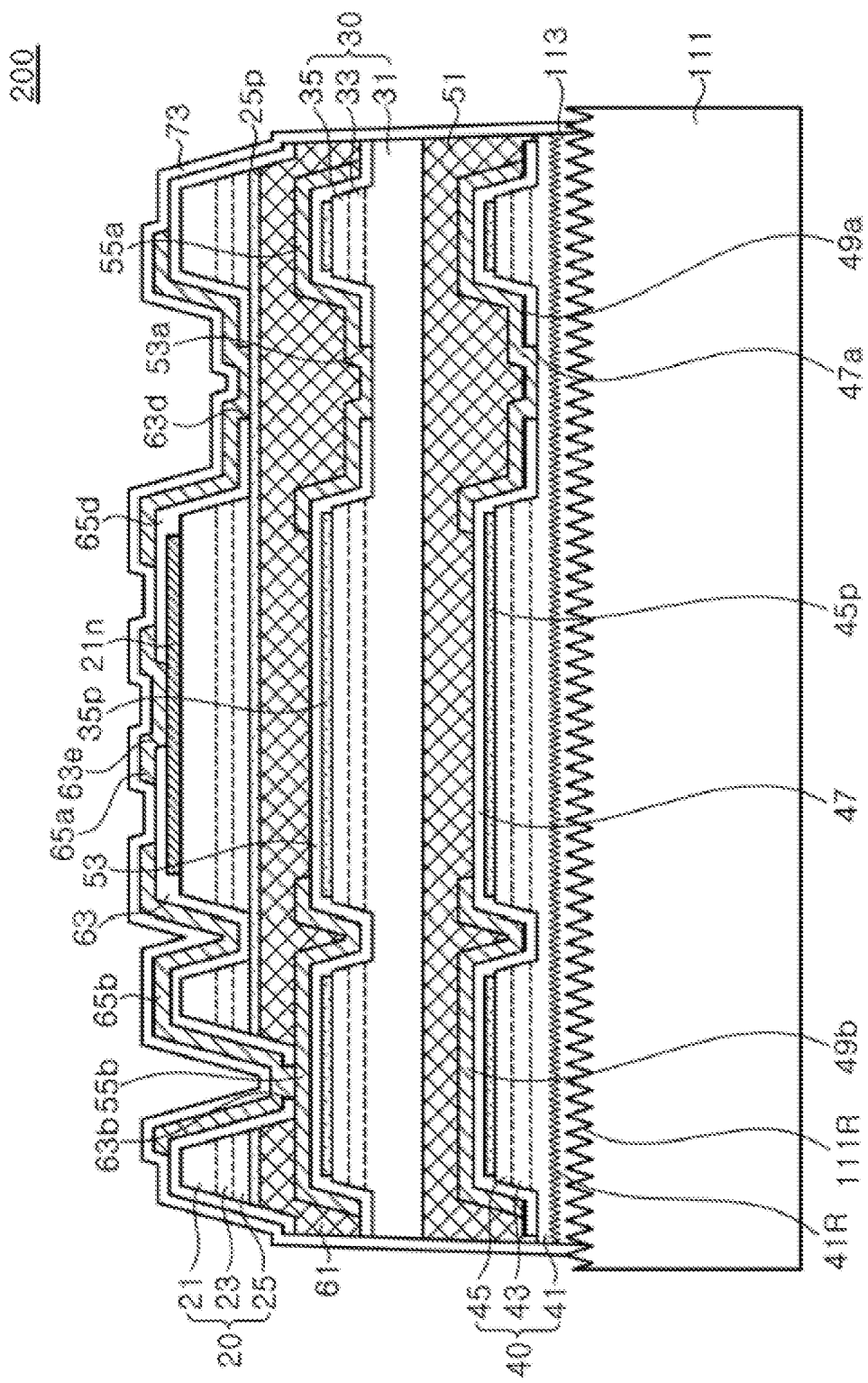
FIG. 18 is a schematic cross-sectional view illustrating a light emitting device according to an exemplary embodiment.

FIG. 18 is a schematic cross-sectional view illustrating a light emitting device according to an exemplary embodiment.

Referring to FIG. 18, although a light emitting device 200 according to the illustrated exemplary embodiment is substantially similar to the light emitting device 100 described with reference to FIGS. 3A, 3B, 3C, 4A, 4B, and 4C, surface structures of a substrate 111 and a first conductivity type semiconductor layer 41 of the third LED stack 40 are different, and a bonding layer 113 is further included.

The substrate 111 is a transparent substrate that transmits light generated in the first, second, and third LED stacks 20, 30, and 40. The substrate 111 is not particularly limited, but may be, for example, PET, a glass substrate, a quartz substrate, a sapphire substrate, or the like.

The substrate 111 may include a concave-convex pattern 111R on a surface facing the third LED stack 40. The concave-convex pattern 111R equalizes viewing angles of light emitted from the first, second, and third LED stacks 20, 30, and 40. As such, it is possible to prevent a color difference from occurring depending on an angle at which a viewer sees an image.

The concave-convex pattern 111R may be regular or irregular. The concave-convex pattern 111R may have, for example, a pitch of 3 μm, a diameter of 2.8 μm, and a height of 1.8 μm. The concave-convex pattern 111R may be a pattern generally applied to a patterned sapphire substrate, but the inventive concepts are not limited thereto.

Meanwhile, the first conductivity type semiconductor layer 41 of the third LED stack 40 may have a concave-convex pattern 41R on a surface facing the substrate 111. The first conductivity type semiconductor layer 41 may be formed using, for example, a photoelectrochemical (PEC) etching technique. The concave-convex pattern 41R equalizes the viewing angles of light emitted from the first, second, and third LED stacks 20, 30, and 40. The concave-convex pattern 41R may be denser than the concave-convex pattern 111R on the substrate 111.

The bonding layer 113 bonds the substrate 111 and the third LED stack 40 to each other. The bonding layer 113 may include, for example, an optically clear adhesive (OCA), such as epoxy, polyimide, SU8, spin-on-glass (SOG), benzocyclobutene (BCB), but the inventive concepts are is not limited to.

The light emitting device 200 according to the illustrated exemplary embodiment may be manufactured through a manufacturing method similar to that of the light emitting device 100 described with reference to FIGS. 5A through 17B, but there is a difference in that a process is carried out after the third LED stack 40 is bonded to the substrate 111 using a TBDB technology. For example, the third LED stack 40 may be grown on the substrate 11, and a third transparent electrode 45p may be formed on the third LED stack 40. Thereafter, before the third LED stack 40 is patterned, the third LED stack 40 is separated from the substrate 11 using a temporary substrate, and the concave-convex pattern 41R is formed on the exposed first conductivity type semiconductor layer 41. Subsequently, after the third LED stack 40 is bonded on the substrate 111 and the temporary substrate is removed, a patterning process of the third LED stack 40 may be carried out. Subsequent processes may be carried out as described above with reference to FIGS. 6A through 17B to manufacture the light emitting device 200.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A stacked light emitting device, comprising:
   a first LED stack;
   a second LED stack disposed under the first LED stack;
   a third LED stack disposed under the second LED stack;
   each of the first LED stack, the second LED stack, and the third LED stack has a light generation region and a peripheral region disposed around the light generation region;
   a plurality of pads disposed over the first LED stack; and
   a third-1 connector and a third-2 connector disposed on the third LED stack, wherein:
   the third-1 connector and the third-2 connector are electrically connected to a first conductivity type semiconductor layer and a second conductivity type semiconductor layer of the light generation region of the third LED stack, respectively, and
   the third-1 connector, the third-2 connector, or both cover a side surface of the peripheral region of the third LED stack,
   wherein, in each of the first LED stack, the second LED stack and the third LED stack, the peripheral region is arranged to surround the light generation region on a horizontal plane.

2. The stacked light emitting device of claim 1, wherein the third-1 connector and the third-2 connector together cover 80% or more of the side surface of the peripheral region of the third LED stack.

3. The stacked light emitting device of claim 1, wherein the third-1 connector and the third-2 connector together cover 80% or more of a side surface of the light generation region of the third LED stack.

4. The stacked light emitting device of claim 1, further comprising:
   a second-1 connector, a second intermediary connector, and a second-2 connector disposed between the first LED stack and the second LED stack, wherein:
   the second-1 connector and the second-2 connector are electrically connected to a first conductivity type semiconductor layer and a second conductivity type semiconductor layer of the second LED stack, respectively, and
   the second intermediary connector is electrically connected to the third-2 connector through the peripheral region of the second LED stack.

5. The stacked light emitting device of claim 4, wherein the second-1 connector, the second intermediary connector, and the second-2 connector cover a side surface of the peripheral region of the second LED stack.

6. The stacked light emitting device of claim 5, wherein the second-1 connector, the second intermediary connector, and the second-2 connector together cover 80% or more of the peripheral region of the second LED stack.

7. The stacked light emitting device of claim 5, wherein the second-1 connector, the second intermediary connector, and the second-2 connector together cover 80% or more of a side surface of the light generation region of the second LED stack.

8. The stacked light emitting device of claim 4, further comprising:
   a first-1 connector, a first-2 connector, a first-1 intermediary connector, and a first-2 intermediary connector disposed between the first LED stack and the plurality of pads, wherein:
   the first-1 connector and the first-2 connector are electrically connected to a first conductivity type semiconductor layer and a second conductivity type semiconductor layer of the first LED stack, and
   the first-1 intermediary connector and the first-2 intermediary connector are electrically connected to the second intermediary connector and the second-2 connector through the peripheral region of the first LED stack, respectively.

9. The stacked light emitting device of claim 8, wherein:
   the first-1 connector, the second-1 connector, and the third-1 connector are electrically connected to one another; and the first-2 connector, the second-2 connector, and the third-2 connector are electrically spaced apart from one another.

10. The stacked light emitting device of claim 9, wherein the plurality of pads further comprises:
a first pad electrically connected to the first-1 connector, the second-1 connector;
a second pad electrically connected to the third-2 connector;
a third pad electrically connected to the second-2 connector; and
a fourth pad electrically connected to the first-2 connector.

11. The stacked light emitting device of claim 9, wherein:
a first pad of the plurality of pads is electrically connected to the first, second, and third LED stacks by being commonly electrically connected to each first conductivity type semiconductor layer of the first LED stack, the second LED stack and the third LED stack.

12. The stacked light emitting device of claim 10, wherein the first, second, third, and fourth pads are disposed on the peripheral region of the first LED stack, respectively.

13. The stacked light emitting device of claim 10, wherein the first-1 connector, the first-2 connector, the first-1 intermediary connector, and the first-2 intermediary connector cover 80% or more of a side surface of the light generation region of the first LED stack.

14. The stacked light emitting device of claim 13, wherein the first-1 connector, the first-2 connector, the first-1 intermediary connector, and the first-2 intermediary connector cover the side surface of the light generation region of the first LED stack, respectively.

15. The stacked light emitting device of claim 1, wherein the light generation regions of the first, second, and third LED stacks are at least partially overlapped with one another in a direction perpendicular to the horizontal plane;
the light generation regions of the first, second, and third LED stacks are overlapped with one another by 90% or more.

16. The stacked light emitting device of claim 1, wherein the light generation region of the first LED stack has a different shape from those of the light generation regions of the second and third LED stacks;
the light generation region is arranged in an arrangement direction rotated from arrangement directions of the light generation regions of the second and third LED stacks; or
both.

17. The stacked light emitting device of claim 1, further comprising:
a light-transmitting substrate disposed under the third LED stack,
wherein the light-transmitting substrate has a concave-convex pattern on a surface facing the third LED stack.

18. The stacked light emitting device of claim 17, further comprising:
a bonding layer disposed between the light-transmitting substrate and the third LED stack,
wherein the third LED stack has a concave-convex pattern on a surface facing the light-transmitting substrate,
the concave-convex pattern of the third LED stack is denser than the concave-convex pattern of the light-transmitting substrate.

19. A display apparatus, comprising:
a circuit board; and
a plurality of light emitting devices mounted on the circuit board,
the plurality of light emitting devices comprising:
a first LED stack;
a second LED stack disposed under the first LED stack;
a third LED stack disposed under the second LED stack;
each of the first LED stack, the second LED stack, and the third LED stack has a light generation region and a peripheral region disposed around the light generation region;
a plurality of pads disposed over the first LED stack, and electrically connected to the first LED stack, the second LED stack, and the third LED stack, the plurality of pads bonded toward the circuit board;
a third-1 connector and a third-2 connector disposed on the third LED stack, wherein:
the third-1 connector and the third-2 connector are electrically connected to a first conductivity type semiconductor layer and a second conductivity type semiconductor layer of the light generation region of the third LED stack, respectively,
at least one of the third-1 connector and the third-2 connector covers a side surface of the peripheral region of the third LED stack,
wherein, in each of the first LED stack, the second LED stack and the third LED stack, the peripheral region is arranged to surround the light generation region on a horizontal plane.

20. The display apparatus of claim 19, wherein the third-1 connector and the third-2 connector together cover 80% or more of the side surface of the peripheral region of the third LED stack.

* * * * *